(12) United States Patent
Iwamoto

(10) Patent No.: US 6,763,079 B1
(45) Date of Patent: Jul. 13, 2004

(54) SEMICONDUCTOR DEVICE ALLOWING EASY CONFIRMATION OF OPERATION OF BUILT IN CLOCK GENERATION CIRCUIT

(75) Inventor: Hisashi Iwamoto, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 09/252,910

(22) Filed: Feb. 19, 1999

(30) Foreign Application Priority Data

Aug. 25, 1998 (JP) .......................................... 10-238778

(51) Int. Cl.$^7$ ............................................... H04L 7/08
(52) U.S. Cl. ...................................... 375/376; 327/156
(58) Field of Search ................................ 375/221, 354, 375/219, 371, 373–376; 327/158, 161, 156, 141, 100, 144

(56) References Cited

U.S. PATENT DOCUMENTS

| | | | | |
|---|---|---|---|---|
| 5,223,772 A | * | 6/1993 | Carobolante | ................. 318/254 |
| 5,430,394 A | | 7/1995 | McMinn et al. | |
| 5,675,274 A | * | 10/1997 | Kobayashi et al. | .......... 327/158 |
| 5,939,913 A | * | 8/1999 | Omita | ......................... 327/159 |
| 6,081,550 A | * | 6/2000 | Wolf | .......................... 375/224 |
| 6,092,030 A | * | 7/2000 | Lepejian et al. | ............... 702/79 |
| 6,137,334 A | * | 10/2000 | Miller, Jr. et al. | ........... 327/271 |
| 6,157,690 A | * | 12/2000 | Yoneda | ....................... 375/376 |
| 6,201,829 B1 | * | 3/2001 | Schneider | ..................... 375/221 |

FOREIGN PATENT DOCUMENTS

JP          05-045422          2/1993

* cited by examiner

Primary Examiner—Khai Tran
Assistant Examiner—Kevin M. Burd
(74) Attorney, Agent, or Firm—McDermott Will & Emery LLP

(57) ABSTRACT

A shift register which outputs a delay control signal for a delay line is made controllable at a test mode by a TEST MODE address buffer receiving an external address as a control signal and a phase comparator. Thus whether the delay of the delay line is correctly controlled or not can be confirmed through observation of an internal clock signal int. CLK output from an output buffer at the test and an external clock signal ext. CLK.

22 Claims, 25 Drawing Sheets

B11

B14

SEMICONDUCTOR DEVICE ALLOWING EASY CONFIRMATION OF OPERATION OF BUILT IN CLOCK GENERATION CIRCUIT

BACKGROUND OF THE INVENTION

1. Field of the Invention

The present invention relates to a semiconductor device, and more particularly to a semiconductor device including an internal clock generation circuit for generating an internal clock in synchronization with a periodically supplied clock signal.

2. Description of the Background Art

Though an operating speed of a dynamic random access memory (DRAM) employed as a main memory in a system using a memory has been increased, it is still incomparable with that of a micro processor (MPU). It is one reason why an access time and a cycle time of a DRAM is often regarded as a bottle neck causing an overall system performance degradation. To avoid this problem, a Double Data Rate SDRAM (DDR SDRAM) which operates in synchronization with complementary clock signals has recently been proposed as a main memory for fast speed MPU.

In a specification proposed for the DDR SDRAM for allowing access time decrease, four consecutive data per one data input/output terminal, for example, are accessible at a fast speed in synchronization with complementary system clock signals (ext. CLK and ext. /CLK).

FIG. 20 illustrates waveforms showing an operation of the DDR SDRAM upon being accessed.

In this DDR SDRAM, eight-bit data (byte data) can be input/output through data input/output terminals DQ0–DQ7. FIG. 20 illustrates operations upon writing and reading of four consecutive data (8×4=32 bits in total). The number of consecutively read data is called a burst length which is changeable by a mode register in the DDR SDRAM.

Operation mode is determined by a combination of states of external control signals /RAS, /CAS and /WE at an edge of the external clock signal ext. CLK. The combination of the states of the external control signals is usually called a command. Here, the external control signal /RAS is a row address strobe signal, the external control signal /CAS is a column address strobe signal and the external control signal /WE is a write enable signal. A signal Add. is an address signal supplied from an external source, a signal DQS is a data strobe signal indicating a timing of receiving/supplying of data and a signal D/Q is a data signal received/supplied via the data input/output terminal.

With reference to FIG. 20, at time t1, the external control signals /RAS, /CAS and /WE and the address signal Add. are taken in at a rising edge of the clock signal ext. CLK. The address signal Add. is supplied as a row address X and a column address Y multiplexed in a time divisional manner. At the rising edge of the clock signal ext. CLK at t1, if the external control signal /RAS is at an "L" (a logical low) which is an active state, an address signal Add. at the time is taken in as a row address Xa.

At time t2 at a rising edge of the clock signal ext. CLK, if the external control signal CAS is at "L" which is an active state, an address signal Add. at the time is taken in as a column address Yb.

The signals, that is, a command and the address signal are taken in at a rising edge of the ext. CLK. According to the taken row address Xa and column address Yb, a row and a column are selected in the DDR SDRAM.

When a predetermined clock period (3.5 clock cycles in FIG. 20) is elapsed at time t4 after the fall of the external control signal /RAS to "L", first four data q0, q1, q2 and q3 are supplied as outputs from time t4 to t8. These four data are supplied in synchronization with cross points of the clock signal ext. CLK and the clock signal ext. /CLK.

To enable a fast data transfer, the data strobe signal DQS for notifying a timing of data receipt is supplied as an output in the same phase with the output data.

At time t3, overwrite (precharge) of a memory cell is performed, which is performed when the external control signals /RAS and /WE are at "L" at a rising edge of the clock signal ext. CLK.

A writing operation is illustrated from time t9 onward. A row address Xc is taken at the writing operation in the same manner as at the data reading.

At time t10, if the external control signals /CAS and /WE are both at "L" which is an active state at a rising edge of the clock signal ext. CLK, a column address Yd is taken in, and in addition, at time t11 currently supplied data d0 is taken in as a first write data.

In other words, in response to falls of external control signals /RAS and /CAS, a column and a row are selected in the DDR SDRAM. From time t12 to t14, input data d1, d2 and d3 are sequentially taken in synchronization with the data strobe signal DQS and written into the memory cells.

As described in the foregoing, in view of the overall system performance, as a speed of system clock increases along with the increase in the processing speed of MPU, the problem associated with the speed of internal clock signal (int. CLK) cannot be disregarded even in the DDR SDRAM. An internal clock generation circuit is proposed which employs a Delay Locked Loop (hereinafter referred to as DLL) for receiving a clock signal (ext. CLK) which is generated in a semiconductor device or supplied from an external source and generating an internal clock signal (int. CLK) in synchronization with the clock signal.

FIG. 21 is a block diagram showing a configuration of a conventional DLL circuit.

As shown in FIG. 21, the conventional DLL circuit includes a clock buffer B11 receiving an external clock signal ext. CLK supplied from an external source, a phase comparator B12 comparing a clock signal ECLK and a clock signal RCLK supplied from clock buffer B11 as outputs and supplying as an output control signals /UP and DOWN according to a phase difference, a charge pump B13 receiving the control signals /UP and DOWN, a loop filter B16 receiving an output from charge pump B13 and supplying as an output control voltage VCOin, a voltage controlling delay circuit B15 receiving the clock signal ECLK supplied as the output from clock buffer B11, delaying it according to control voltage VCOin and supplying as an output the resulting delayed clock ECLK' and a clock buffer B14 receiving the delayed clock ECLK' and supplying the clock signal RCLK and the internal clock signal int. CLK as outputs.

FIG. 22 is a circuit diagram showing a configuration of phase comparator B12 shown in FIG. 21.

With reference to FIG. 22, phase comparator B12 includes an inverter B12a receiving and inverting the clock signal ECLK, an NAND circuit B12f receiving an output of inverter B12a and a potential of a node Nl and having its output connected to a node Nf, an NAND circuit B121 having its inputs connected to nodes Nf, Nr and Ng and its output connected to node Nl, an NAND circuit B12g having its inputs connected to nodes Nf and Nh and its output connected to node Ng, an NAND circuit B12h having its inputs connected to nodes Ng and Nr and its output connected to node Nh and inverters B12c and B12d connected in series, having their input connected to the node Nl and supplying as an output the control signal /UP.

Phase comparator B12 further includes an inverter B12b receiving the clock signal RCLK, an NAND circuit B12k receiving an output of inverter B12b and a potential of a node Nn and having its output connected to a node Nk, an NAND circuit B12m having its inputs connected to nodes Nj, Nr and Nk and its output connected to node Nn, an NAND circuit B12j having its inputs connected to nodes Ni and Nk and its output connected to node Nj, an NAND circuit B12i having its inputs connected to nodes Nr and Nj and its output connected to node Ni, an NAND circuit B12n having its inputs connected to nodes Ng, Nf, Nk and Nj and its output connected to node Nr and an inverter B12e having its input connected to the node Nn and supplying as an output the control signal DOWN.

FIG. 23 is a circuit diagram showing a configuration of clock buffer B11 shown in FIG. 21.

With reference to FIG. 23, clock buffer B11, including m inverters Ia1–Iam (m is a natural number) connected in series, amplifies the external clock signal ext. CLK and supplies as an output the clock signal ECLK. Sizes of symbols of inverters Ia1–Iam represents output drivability of respective inverters, which gradually increase toward an output stage. The number of stages m of inverters Ia1–Iam is set according to input capacitance of phase comparator B12 and voltage controlling delay circuit B15.

FIG. 24 is a circuit diagram showing a configuration of clock buffer B14 shown in FIG. 21.

Next, with reference to FIG. 24, clock buffer B14 including n inverters Ib1–Ibn (n is a natural number) connected in series, amplifies the delayed clock ECLK' supplied as the output from the voltage controlling delay circuit and supplies as outputs the internal clock signal int. CLK and the clock signal RCLK. The internal clock signal int. CLK is supplied to a control circuit section controlling each memory block.

Drivabilities of inverters Ib1–Ibn constituting clock buffer B14 also gradually increase toward an output stage as the inverters in clock buffer B11.

The number of stages n of inverters Ib1–Ibn is set according to an amount of load capacitance.

An inverter (Ib4 in FIG. 24) supplying as an output the clock signal RCLK is selected so that the phase difference between the external clock signal ext. CLK and the internal clock signal int. CLK becomes a predetermined amount.

FIG. 25 is a circuit diagram showing a configuration of charge pump B13 and loop filter B16 shown in FIG. 21.

With reference to FIG. 25, charge pump B13 includes a constant current source B13a, P channel MOS transistor B13b, an N channel MOS transistor B13c and a constant current source B13d connected in series between a power supply node to which power supply potential Vcc is applied and a ground node.

The gate of P channel MOS transistor B13b receives the control signal /UP whereas the gate of N channel MOS transistor B13c receives the control signal DOWN. A node N13 connecting P channel MOS transistor B13b and N channel MOS transistor B13c is an output node of charge pump B13.

Loop filter B16 includes resistance B16a and a capacitor B16b connected in series between the output node N13 of charge pump B13 and a ground node.

FIG. 26 is a circuit diagram showing a configuration of voltage controlling delay circuit B15 shown in FIG. 21.

With reference to FIG. 26, voltage controlling delay circuit B15 includes a bias generation circuit B21 and k delay time variable inverters B221–B22k (k is a natural number) connected in series.

Bias generation circuit B21 includes an N channel MOS transistor B21c having a gate receiving control voltage VCOin, a resistance B21r provided between a source of N channel MOS transistor B21c and the ground potential, a P channel MOS transistor B21a having a gate and a drain connected to a drain of N channel MOS transistor B21c and a source coupled with power supply potential Vcc, a P channel MOS transistor B21b having a gate receiving potential of the drain of N channel MOS transistor B21c and a source coupled with power supply potential Vcc and an N channel MOS transistor B21d having a drain and a gate connected to a drain of P channel MOS transistor B21b and a source coupled with the ground potential.

Potential of the drain of N channel MOS transistor B21c is at the level of a control potential Vp1 whereas potential of the drain of P channel MOS transistor B21b is at the level of a control potential Vn.

Delay time variable inverter B22k (k is a natural number) includes a P channel MOS transistor B22ak having a gate receiving control potential Vp1 and limiting a current from a power supply node to which power supply potential Vcc is applied, an N channel MOS transistor B22dk having a gate receiving the control potential Vn and limiting a current flowing to a ground node, and a P channel MOS transistor B22bk and an N channel MOS transistor B22ck connected in series between a drain of P channel MOS transistor B22ak and a drain of N channel MOS transistor B22dk.

A gate of P channel MOS transistor B22bk and a gate of N channel MOS transistor B22ck are connected to form an input node of the delay time variable inverter whereas a drain of P channel MOS transistor B22bk forms an output node of the delay time variable inverter.

Next, an operation of voltage controlling delay circuit B15 shown in FIG. 26 will be described. As control voltage Vp1 is applied to all gates of P channel MOS transistors B22a1–B22ak and control voltage Vn is applied to all gates of N channel MOS transistors B22d1–B22dk, a current corresponding to control voltage VCOin flows to each of delay time variable inverters B221–B22k. With the increase in the control voltage VCOin, the current flow increases and shortens a delay time caused by inversion at the inverter whereby a delay time at voltage controlling delay circuit B15 is reduced. Conversely when the current flow decreases because of the decrease in control voltage VCOin, the delay time caused by inversion at each inverter and therefore the delay time at voltage controlling delay circuit B15 grows long.

Next is the description of an operation of the DLL circuit shown in FIG. 21.

When a phase of the clock signal RCLK lags behind that of the clock signal ECLK, phase comparator B12 supplies as outputs the control signal /UP having a pulse width corresponding to a phase difference between the clock signal ECLK and the clock signal RCLK and the control signal DOWN having a predetermined pulse width. Then by the operation of charge pump B13, control voltage VCOin which is the output of the loop filter increases and the delay time at voltage controlling delay circuit B15 decreases. Hence the phase of the clock signal RCLK advances and the phase difference between the clock signal ECLK and the clock signal RCLK becomes smaller.

Conversely when the phase of the clock signal RCLK leads that of the clock signal ECLK, phase comparator B12 supplies as outputs the control signal DOWN having a pulse width corresponding to the phase difference between the clock signal RCLK and the clock signal ECLK and the control signal /UP having a predetermined pulse width. Then correspondingly, charges are pulled out from loop filter B16 to charge pump B13. Thus control voltage VCOin is pulled down and the delay time of voltage controlling delay circuit B15 increases. Hence the phase of the clock signal RCLK is delayed and the phase difference between the clock signal RCLK and the clock signal ECLK becomes smaller.

After a repetition of this process, the phase of the clock signal RCLK is finally matched with the phase of the clock signal ECLK.

FIG. 27 illustrates waveforms of the external clock signal ext. CLK and the internal clock signal int. CLK shown in FIG. 21, referenced for describing the relation thereof.

As shown in FIG. 27, when there is no phase difference between the clock signal RCLK and the clock signal ECLK, clock buffer B14 supplies as an output the internal clock signal int. CLK having a phase advanced by a desired amount from that of the external clock signal ext. CLK.

The above described DLL circuit, however, is difficult to test to confirm its operation.

For example, in the DLL circuit, a frequency range of the external clock signal ext. CLK where the DLL circuit is normally operable is not infinite but finite. This frequency range is shifted because of fluctuation in performance caused in manufacturing semiconductor devices (process variation) and so on. For testing the shift in the frequency range, output voltage VCOin of loop filter B16 shown in FIG. 21 can be monitored. Here, however, the measurement with high precision is required and an error is inevitable to some extent.

SUMMARY OF THE INVENTION

An object of the present invention is to provide a semiconductor device including an internal clock generation circuit such as a DLL circuit, a PLL circuit or the like to which an operation confirmation test can easily be performed.

The present invention is, in brief, a semiconductor device including an internal clock generation circuit for generating an internal clock in synchronization with a reference clock and the semiconductor device includes a determination circuit. The internal clock generation circuit includes a delay line delaying a first clock generated according to the reference clock according to an n-bit (n: an integer of at least 2) control signal and supplying as an output the internal clock, a phase comparison circuit comparing phases of the internal clock and the reference clock, and a shift register supplying as an output the control signal according to result of comparison at the phase comparison circuit. The shift register shifts position of a transition bit in the control signal according to the result of comparison, when lower m bit (m: an integer at least 0 and at most n) among the n bits of the control signal has a first logic value and m+1 th bit to n th bit from the least significant bit has a second logic value, and a m th bit from the least significant bit is the transition bit. The determination circuit determines that a j th (j: an integer at least 0 and less than i) bit from the least significant bit of the control signal has the first logic value and a k th (k: an integer more than i and at most n) bit from the least significant bit of the control signal has the second logic value, assuming that the expected position of the transition bit is i th from the lowest position when the internal clock is normally generated, and supplies result as an output.

In accordance with another aspect of the present invention, the present invention is a semiconductor device including an internal clock generation circuit for generating an internal clock in synchronization with a reference clock, and the semiconductor device includes a first data terminal and a switching circuit. The internal clock generation circuit includes a first delay line for delaying a first clock generated according to the reference clock according to an n-bit (n: an integer at least 2) control signal and supplying as an output the internal clock, a phase comparison circuit comparing phases of the internal clock and the reference clock and a shift register supplying as an output the control signal according to result of comparison at the phase comparison circuit. The shift register shifts a position of a transition bit in the control signal according to the result of comparison when lower m bit (m: an integer at least 0 and at most n) among the n bits of the control signal has a first logical value and m+1 th bit to n th bit from the least significant bit has a second logical value, and a m th bit from the least significant bit is the transition bit. The first data terminal is employed for receiving/transmitting from/to an external source predetermined data at a normal operation. The switching circuit supplies as an output to the first data terminal the internal clock according to a test mode signal activated when an operation of the internal clock generation circuit is confirmed.

In accordance with still another aspect of the present invention, the present invention is a semiconductor device including an internal clock generation circuit for generating an internal clock in synchronization with a reference clock and the semiconductor device includes a phase determination circuit. The internal clock generation circuit includes a first delay line delaying a first clock generated according to the reference clock according to an n-bit (n: an integer at least 2) control signal and supplying as an output the internal clock, a second delay line delaying the first clock according to the control signal and supplying as an output a second clock, a phase comparison circuit comparing phases of the internal clock and the reference clock and a shift register supplying as an output the control signal according to result of comparison at the phase comparison circuit. The phase determination circuit determines whether phase difference between the internal clock and the first clock is at most a predetermined value or not.

Therefore a main advantage of the present invention lies in that the shift of the operating frequency range caused by the fluctuation of a delay time of a delay line because of the process variation can be easily detected by extraction and comparison of a portion of the control signal supplied as an output from the shift register included in the internal clock generation circuit.

Another advantage of the present invention lies in that the operation of the internal clock circuit can be easily and surely confirmed because a test mode is provided in which the internal clock generated from the internal clock generation circuit is directly supplied as an output.

Still another advantage of the present invention lies in that unsatisfactory behavior of the delay line which is difficult to detect can be detected because two delay lines with the identical configuration are provided and the test mode for comparing the outputs thereof is provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The preferred embodiment of the present invention will be described in detail hereinafter with reference to the drawings in which the same character indicates the same or corresponding element.

First Embodiment

Figure 1:
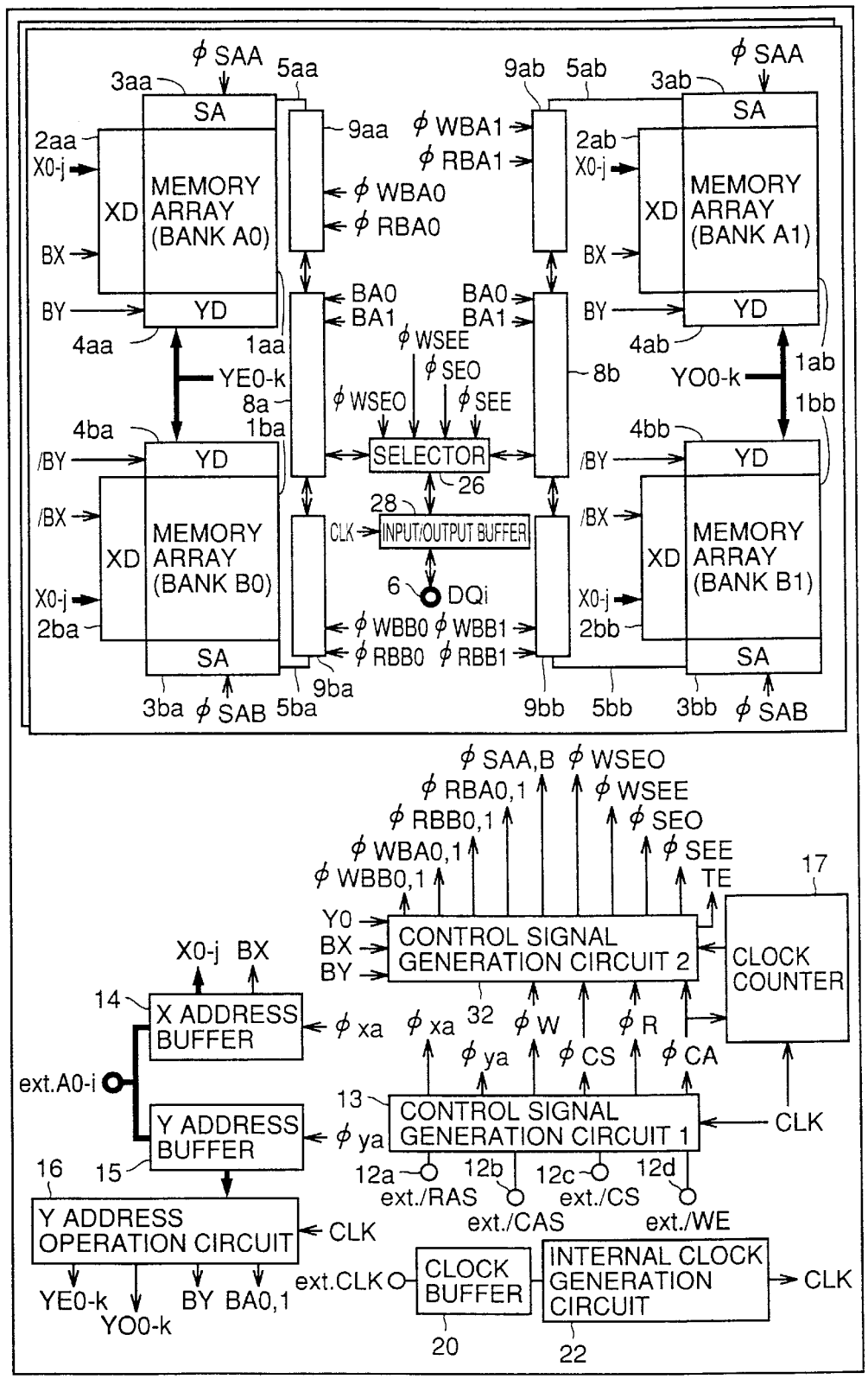
FIG. 1 is a schematic diagram showing a configuration of a semiconductor device in accordance with a first embodiment of the present invention.

FIG. 1 is a schematic diagram showing a configuration of the semiconductor device in accordance with the first embodiment of the present invention.

Though a DDR SDRAM is shown as an example of the semiconductor device here, the present invention can be applied to any type of semiconductor device as far as the device receives an external clock and synchronously generates an internal clock. FIG. 1 shows a configuration of a portion associated with receiving/transmitting of one-bit data and peripherals. The portion associated with receiving/transmitting of data is provided for each data input/output terminal.

With reference to FIG. 1, the SDRAM includes memory arrays 1aa, 1ab, 1ba and 1bb each having a plurality of memory cells arranged in a matrix.

The SDRAM includes two banks, that is, a bank A having memory arrays 1aa and 1ab and a bank B having memory arrays 1ba and 1bb.

In bank A, memory array 1aa constitutes a sub bank A0 and memory array 1ab constitutes a sub bank A1. In bank B, memory array 1ba constitutes a sub bank B0 and memory array 1bb constitutes a sub bank B1.

The SDRAM acts as a two-bank SDRAM. Each of banks A and B can independently be driven to an active/inactive state. A bank is designated by a bank address supplied at the same time with each command.

For memory array 1aa, a group of X decoders 2aa being activated when a bank address signal BX is active, decoding a row address signal X0-j and driving an addressed row in memory array 1aa to a selected state, a group of sense amplifiers 3aa being activated when a sense amplifier activation signal φSAA is active, detecting, amplifying, and latching data in a memory cell connected to a selected row in memory array 1aa and a group of Y decoders 4aa being activated when a bank address signal BY is active, decoding a column address signal YE0-k and selecting an addressed column in memory array 1aa are provided.

A memory cell on a column selected by the group of Y decoders 4aa is coupled to an internal data bus 5aa. The bank address signal BX is a bank address signal supplied at the same time with an active command or a precharge command which is an instruction of a return to precharge, and the bank address signal BY is a bank address signal supplied at the same time with a read command or a write command.

For memory array 1ab, a group of X decoders 2ab being activated when a bank address signal BX is active, decoding a row address signal X0-j and driving an addressed row in memory array 1aa to a selected state, a group of sense amplifiers 3ab being activated when a sense amplifier activation signal φSAA is active, detecting, amplifying, and latching data in a memory cell connected to a selected row in memory array 1ab and a group of Y decoders 4ab being activated when a bank address signal BY is active, decoding a column address signal Y00-k and selecting an addressed column in memory array 1ab are provided.

A memory cell on a column selected by the group of Y decoders 4ab is coupled to an internal data bus 5ab.

For memory array 1ba, a group of X decoders 2ba being activated when a bank address signal /BX is active, decoding a row address signal X0-j and driving an addressed row in memory array 1ba to a selected state, a group of sense amplifiers 3ba being activated when a sense amplifier activation signal φSAB is active, detecting, amplifying, and latching data in a memory cell connected to a selected row in memory array 1ba and a group of Y decoders 4ba being activated when a bank address signal /BY is active, decoding a column address signal YE0-k and selecting an addressed column in memory array 1ba are provided.

A memory cell on a column selected by the group of Y decoders 4ba is coupled to an internal data bus 5ba.

For memory array 1bb, a group of X decoders 2bb being activated when a bank address signal /BX is active, decoding a row address signal X0-j and driving an addressed row in memory array 1bb to a selected state, a group of sense amplifiers 3bb being activated when a sense amplifier activation signal φSAB is active, detecting, amplifying, and latching data in a memory cell connected to a selected row in memory array 1bb and a group of Y decoders 4bb being activated when a bank address signal /BY is active, decoding a column address signal Y00-k and selecting an addressed column in memory array 1bb are provided.

A memory cell on a column selected by the group of Y decoders 4bb is coupled to an internal data bus 5bb.

Here, the X decoder, the sense amplifier and the Y decoder are described as groups because an X decoder is arranged for each row and a sense amplifier is arranged for each column in a corresponding memory array and an Y decoder is arranged for each column.

A memory cell is simultaneously selected in memory arrays 1aa and 1ab according to bank address signals BX and BY. In memory arrays 1ba and 1bb, a memory cell is simultaneously selected according to bank address signals /BX and /BY.

A write driver & preamplifier 9aa, which amplifies and latches data read out to internal data bus 5aa from memory array 1aa by group of sense amplifiers 3aa in response to an activation of a register activation signal φRBA0, for reading data from memory array 1aa, and receives and latches data supplied from a bank selector 8a in response to an activation of a register activation signal φWBA0 and supplies data as an output to internal data bus 5aa, for writing data into memory array 1aa, is provided.

A write driver & preamplifier 9ab, which amplifies and latches data read out to internal data bus 5ab from memory array 1ab by group of sense amplifiers 3ab in response to an activation of a register activation signal φRBA1, for reading data from memory array 1ab, and receives and latches data supplied from a bank selector 8b in response to an activation of a register activation signal φWBA1 and supplies data as an output to internal data bus 5ab, for writing data into memory array 1ab, is provided.

A write driver & preamplifier 9ba, which amplifies and latches data read out to internal data bus 5ba from memory array 1ba by group of sense amplifiers 3ba in response to an activation of a register activation signal φRBB0, for reading data from memory array 1ba, and receives and latches data supplied from bank selector 8a in response to an activation of a register activation signal φWBB0 and supplies data as an output to internal data bus 5ba, for writing data into memory array 1ba, is provided.

A write driver & preamplifier 9bb, which amplifies and latches data read out to internal data bus 5bb from memory array 1bb by group of sense amplifiers 3bb in response to an activation of a register activation signal φRBB1, for reading data from memory array 1bb, and receives and latches data supplied from bank selector 8b in response to an activation of a register activation signal φWBB1 and supplies data as an output to internal data bus 5bb, for writing data into memory array 1bb, is provided.

Bank selector 8a is provided for write drivers & preamplifiers 9aa and 9ba. Bank selector 8a selects and supplies as an output one of a write driver & preamplifier 9aa data signal and a write driver & preamplifier 9ba data signal according to data select signals BA0 and BA1.

Bank selector 8b is provided for write drivers & preamplifiers 9ab and 9bb. Bank selector 8b selects and supplies as an output one of a write driver & preamplifier 9ab data signal and a write driver & preamplifier 9bb data signal according to data select signals BA0 and BA1.

For bank selectors 8a and 8b, a selector 26 selecting one of signals from bank selectors 8a and 8b according to a select signals φSEO and φSEE at data reading, input/output buffer 28 receiving and amplifying an output from selector 26 and a data input/output terminal 6 supplying an output signal from input/output buffer 28 as an output are provided. At data writing, selector 26 supplies as an output to bank selector 8a or bank selector 8b data received from an external source via input/output buffer 28 in synchronization with the clock signal CLK.

The SDRAM further includes a control signal generation circuit 13 taking in external control signals ext. RAS, ext. /CAS, ext. /CS and ext. /WE respectively supplied to input terminals 12a, 12b, 12c and 12d in synchronization with a rise of the clock signal CLK, inverting their states and generating internal control signals φxa, φya, φW, φCS, φR and φCA.

The signal ext. /CS is a chip select signal. When the chip select signal ext. /CS is in an active state, the synchronous semiconductor memory device receives/transmits data.

The clock signal CLK is a clock signal generated by internal clock generation circuit 22 according to the external clock signal ext. CLK supplied as an input via clock buffer 20 from an external source.

The signal φxa, which is activated when the active command is given, is an instruction signal to take in the row address signal. The signal φya, which is activated when the read command or the write command is given, is an instruction signal to take in the column address signal. The signal φW, which is activated when the write command is given, is an instruction signal to write data. The signal φR which is activated when the active command is given, activates a circuit portion associated with row selection. The signal φCA which is activated when one of the read command and the write command is given, activates a circuit portion (a column related circuit portion) associated with column selection and data input/output.

The synchronous semiconductor memory device further includes an X address buffer 14 taking in an external address signal ext. A0-i in response to an activation of a row address receipt indication signal φxa and generating the internal row address signal X0-j and the bank address signal BX, a Y address buffer 15 being activated when a column address receipt indication signal φya is rendered active, taking in the external address signal ext. A0-i and generating the internal column address signal and a Y address operation circuit 16 generating an even column address signal YE0-k, an odd column address signal YO0-k and bank address signals BY, BA0 and BA1 (BA0, 1) by changing in a predetermined sequence in synchronization with the clock signal CLK an address starting with the internal column address signal supplied from Y address buffer 15.

Y address operation circuit 16 including a burst address counter changes a column address signal every two clock cycles.

The synchronous semiconductor memory device further includes a clock counter 17 counting the internal clock signal CLK in response to an activation of the column activation signal φCA and generating a count up signal at a predetermined timing according to the counted value, a control signal generation circuit 32 receiving the count up signal from clock counter 17, the bank address signals BX and BY and the least significant bit Y0 of the column address signal and generating various internal control signals including φRBB0, φRBB1, φRBA0, φRBA1, φSAA, φSAB, φSEO, φSEE, φWBB0, φWBB1, φWBA0, φWBA1, φWSEO, and φWSEE and a test signal TE.

A control signal is rendered active corresponding to a bank designated according to bank address signals BX and BY. The least significant bit Y0 of the column address signal is employed to indicate which memory array of two memory arrays included in one bank is to be accessed first.

Clock counter 17 including a counter for counting CAS latency and burst length generates the count up signal at a predetermined timing according to a designated operation mode.

Figure 2:
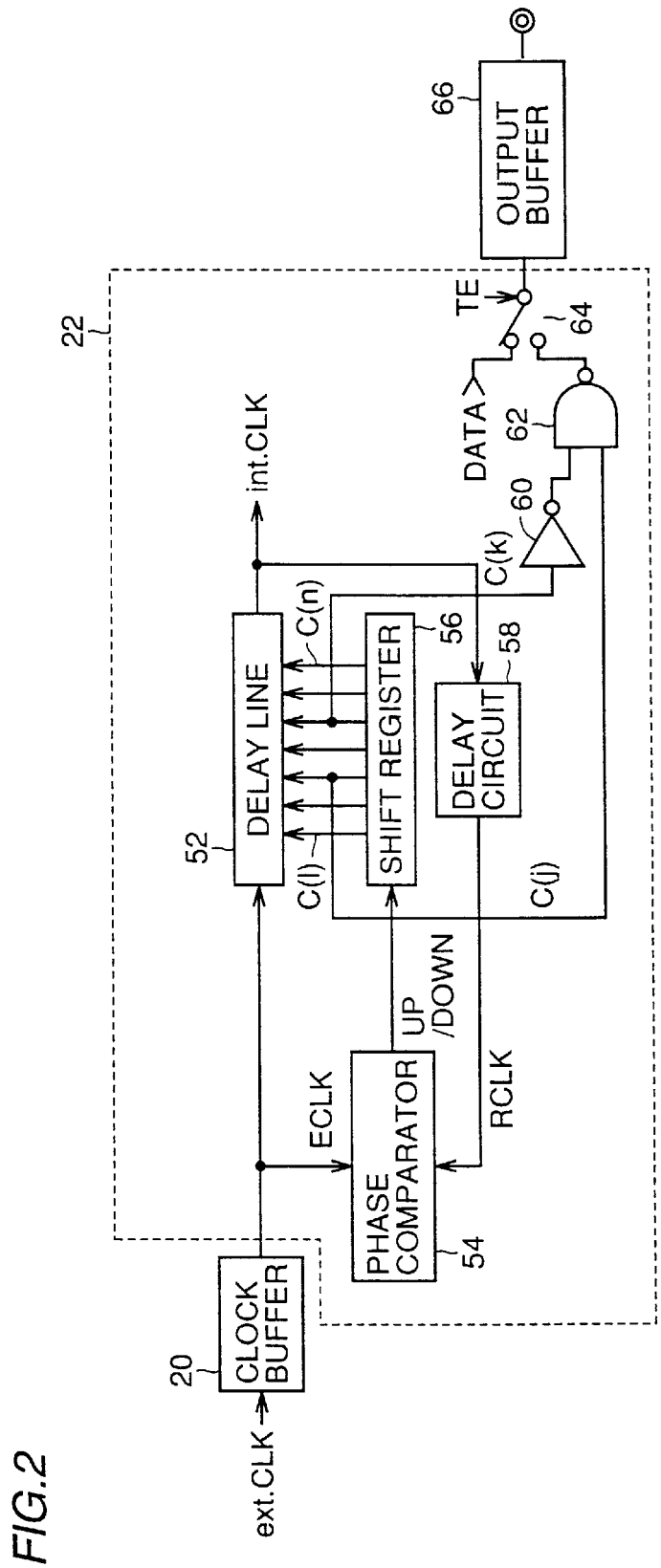
FIG. 2 is a block diagram referenced for describing a configuration of an internal clock generation circuit 22 shown in FIG. 1.

With reference to FIG. 2, internal clock generation circuit 22, which is a digital DLL circuit, includes a delay line 52 receiving and delaying the clock signal ECLK generated by clock buffer 20 upon receiving the external clock signal ext. CLK supplied from a terminal and supplying as an output the internal clock signal int. CLK, a delay circuit 58 receiving and delaying by a predetermined amount of time the internal clock signal int. CLK and supplying as an output the clock signal RCLK, a phase comparator 54 comparing phases of the clock signal ECLK and the clock signal RCLK and supplying as an output result of comparison as the signal UP/DOWN and a shift register 56 supplying as an output a digital signal determining an amount of delay supplied as an output to delay line 52 according to the signals UP/DOWN. As the amount of delay changes discontinuously according to the digital signal, the DLL circuit is called a digital DLL.

Internal clock generation circuit 22 further includes an inverter 60 receiving and inverting a k th signal C(k) among digital signals supplied as outputs from shift register 56, an NAND circuit 62 receiving a j th signal C(j) among digital signals supplied as outputs from shift register 56 and an output of inverter 60 and a switching circuit 64 selectively supplying to an output buffer 66 one of a data signal DATA and an output of NAND circuit 62 according to the test signal TE (here j and k are natural numbers where j<k and k<n).

Here the data signal DATA is a signal supplied as an output via output buffer 66 except time of confirmation of operation of internal clock generation circuit 22. In the SDRAM, for example, the data signal DATA may be a data signal read from a bank.

Figure 3:
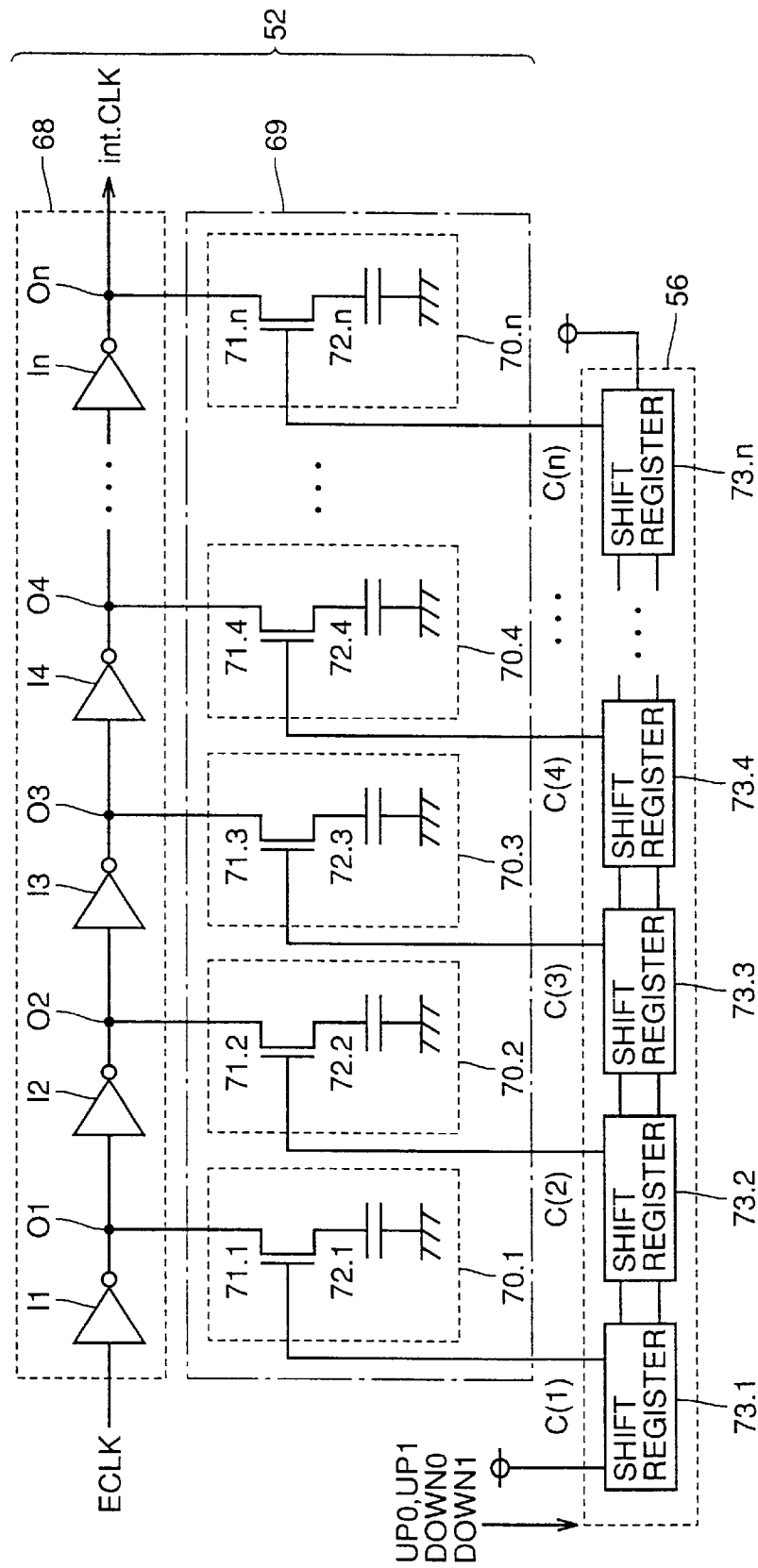
FIG. 3 is a circuit diagram referenced for describing a configuration of a delay line 52 and a shift register 56 shown in FIG. 2.

With reference to FIG. 3, delay line 52 includes a clock delaying section 68 receiving and delaying the clock signal ECLK and supplying as an output the internal clock signal int. CLK and a delay control section 69 controlling an amount of delay at clock delaying section 68 according to the digital signal supplied from shift register 56.

Clock delaying section 68 includes a plurality of inverters (I1, I2, . . . In; where n is an even number) connected in series. Inverter I1 receives the clock signal ECLK from clock buffer 20 and inverter In supplies as an output the internal clock signal int. CLK.

Delay control section 69 includes a plurality of control circuits (70.1, 70.2, . . . 70.n). Control circuits (70.1, 70.2, . . . 70.n) correspond to inverters (I1, I2, . . . In) respectively.

Control circuits (70.1, 70.2, . . . 70.n) each include one N channel MOS transistor (71.1, . . . 71.n) which acts as a switch and one capacitor (72.1, . . . 72.n).

N channel MOS transistors (71.1, . . . 71.n) receive at their gates, control signals (C(1), . . . C(n)) from shift register 56 described hereinafter, respectively.

A specific configuration of control circuit 70.1 will be described. Control circuit 70.1 includes N channel MOS transistor 71.1 and capacitor 72.1. One electrode of capacitor 72.1 is coupled with ground potential Vss. N channel MOS transistor 71.1 is connected between an output node O1 of inverter I1 and the other electrode of capacitor 72.1 and has its gate receiving the control signal C(1) from shift register 56. Upon receiving the control signal C(1) at an H level, N channel MOS transistor 71.1 is rendered conductive.

An operation of control circuit (70.1, 70.2, . . . 70.n) will be briefly described. Hereinafter N channel MOS transistors (7.1.1, 71.2, . . . 71.n) are referred to as switches (71.1, 71.2, . . . , 71.n), respectively, and conductive state/non conductive state of N channel MOS transistor (71.1, 71.2, . . . , 71.n), is regarded as on state/off state of a corresponding switch (71.1, 71.2, . . . , 71.n).

Switches (71.1, 71.2, . . . , 71.n) are rendered on state/off state respectively according to control signals (C(1), C(2), . . . C(n)) supplied from shift register 56. When a switch (71.1, 71.2, . . . , 71.n) is turned to an on state, a corresponding output node (O1, O2, . . . , On) is electrically connected with a corresponding capacitor (72.1, 72.2, . . . , 72.n), whereby a capacitance of the corresponding output node (O1, O2, . . . , On) changes.

As a result, when switch 71.2, for example, is turned to an on state, a potential of an output signal from corresponding output node O2, moderately transits by a value determined by the capacitance of capacitor 72.2. In other words, a delay time at clock delaying section 68 is delicately controlled by switch (71.1, 71.2, . . . , 71.n) attaining on state/off state. In addition, with a smaller capacitor (72.1, . . . , 72.n), a step of change in delay time at clock delaying section 68 can be made smaller.

Next a configuration and an operation of shift register 56 will be described. Shift register 56 includes a plurality of shift registers (73.1, 73.2, . . . , 73.n). Shift registers (73.1, 73.2, . . . , 73.n) are provided corresponding to control circuits (70.1, 70.2, . . . , 70.n), respectively.

Figure 4:
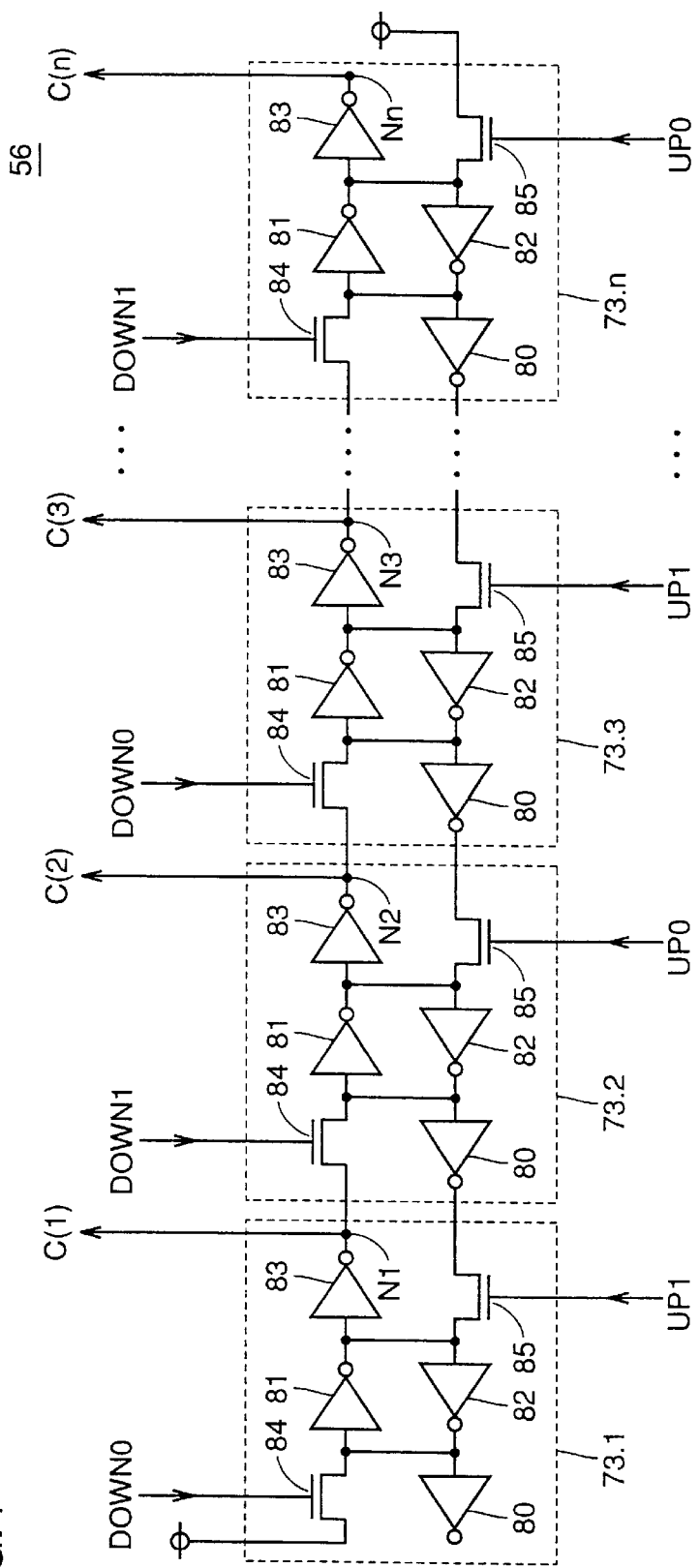
FIG. 4 is a circuit diagram showing a basic configuration of shift register 56 in accordance with the first embodiment of the present invention.

With reference to FIG. 4, shift registers (73.1, 73.2, . . . , 73.n) each 4includes four inverter circuits 80–83 and two N channel MOS transistors 84 and 85.

The state of shift register (73.1, 73.2, . . . , 73.n) changes according to signals DOWN0, DOWN1, UP0, and UP1 supplied as outputs from phase comparator 54 described hereinafter.

In each odd numbered shift register (73.1, 73.3, . . . , 73.n-1), N channel MOS transistor 84 receives the signal DOWN0 at its gate and N channel MOS transistor 85 receives the signal UP1 at its gate. In each even numbered shift registers (73.2, 73.4, . . . , 73.n), N channel MOS transistor 84 receives the signal DOWN1 at its gate and N channel MOS transistor 85 receives the signal UP0 at its gate. The control signals (C(1), C(2), . . . , C(n)), that are digital signals, are supplied as outputs from output nodes (N1, N2, . . . , Nn), respectively, of inverter 83.

Here, one electrode of N channel MOS transistor 84 included in shift register 73.1 and one electrode of N channel MOS transistor 85 included in shift register 73.n are each coupled with internal power supply potential Vcc.

As a specific example, an operation of shift register 73.2 will be described. When the signal DOWN1 attains an H level, for example, N channel MOS transistor 84 is rendered conductive. Then the potential (that is the control signal C(2)) of output node N2 changes according to change in the potential (that is the control signal C(1)) of output node N1 of shift register 73.1 located at the stage immediately before shift register 73.2. Conversely, when the signal DOWN1 attains an L level, N channel MOS transistor 84 is rendered non conductive. Then inverters 81 and 82 latch data supplied at the potential of node N1. The level of the control signal C(2) is determined by the level of latched data (that is the level of control signal C(1) at the fall of the signal DOWN1).

On the other hand, when the signal UP0 attains an H level, N channel MOS transistor 85 is rendered conductive. Then the potential of the control signal C(2) changes according to the potential (that is the control signal C(3)) of output node N3 of shift register 73.3 located at the stage immediately after shift register 73.2. On the other hand, when the signal UP0 attains an L level, N channel MOS transistor 85 is rendered non conductive. Then, inverters 81 and 82 latch data supplied as an output from inverter 80. The level of the control signal C(2) is determined by the level of latched data (that is the level of control signal C(2) at the fall of the signal UP0).

In this configuration, when the signal DOWN0 and the signal DOWN1 are alternately activated, power supply potential Vcc is applied to an input of inverter 81 via N channel MOS transistor 84 in shift register 73.1. This data is sequentially transmitted from shift register 73.2 to shift register 73.3, . . . 73.n thereby making the control signals C(1)–C(n) an H level sequentially from the control signal C(1) side.

On the other hand, when the signal UP0 and the signal UP1 are alternately activated, power supply potential Vcc is applied to an input of inverter 82 by N channel MOS transistor 85 of shift register 73.n, thereby pulling the control signal C(n) to an L level. As this data is sequentially transmitted from shift register 73.n to shift register 73.1, the control signals C(1)–C(n) are rendered an L level sequentially from the control signal C(n) to C(1).

Figure 5:
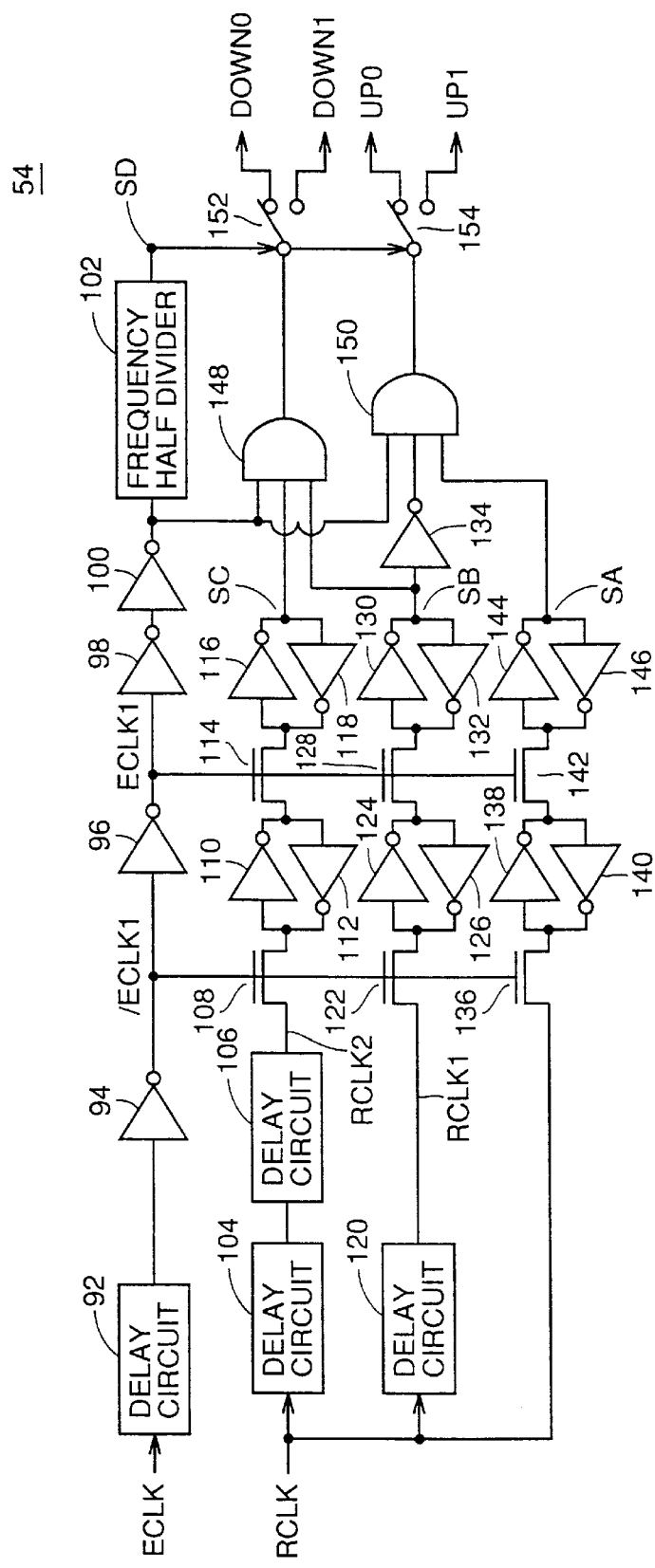
FIG. 5 is a circuit diagram showing a configuration of a phase comparator 54 in accordance with the first embodiment of the present invention.

Referring to FIG. 5, phase comparator 54 includes a delay circuit 92 receiving and delaying the clock signal ECLK, an inverter 94 receiving and inverting an output from delay circuit 92 and supplying as an output a clock signal /ECLK1, an inverter 96 receiving and inverting the clock signal /ECLK1 and supplying as an output the clock signal ECLK1, inverters 98 and 100 connected in series and receiving the clock signal ECLK1 and a frequency half divider 102 receiving an output from inverter 100, dividing a frequency thereof by two and supplying as an output a signal SD.

Phase comparator 54 further includes a delay circuit 104 receiving and delaying the clock signal RCLK, a delay circuit 106 receiving and further delaying an output of delay circuit 104 and supplying as an output a clock signal RCLK2, an N channel MOS transistor 108 being activated by the clock signal /ECLK1, an inverter 110 receiving and inverting the clock signal RCLK2 when N channel MOS transistor 108 is conductive, an inverter 112 receiving and inverting an output of inverter 110 and supplying the resulting signal as an output to the input of inverter 110, an N channel MOS transistor 114 being activated by the clock signal ECLK1, an inverter 116 receiving and inverting the output of inverter 110 and supplying as an output a signal SC when N channel MOS transistor 114 is conductive and an inverter 118 receiving and inverting the signal SC and supplying as an output the resulting signal to an input node of inverter 116.

Phase comparator 54 further includes a delay circuit 120 receiving and delaying the clock signal RCLK and supplying as an output the clock signal RCLK1, an N channel MOS transistor 122 being activated in response to the clock signal /ECLK1, an inverter 124 receiving and inverting the clock signal RCLK1 when N channel MOS transistor 122 is conductive, an inverter 126 receiving and inverting an output of inverter 124 and supplying as an output the resulting signal to an input node of inverter 124, an N channel MOS transistor 128 being activated in response to the clock signal ECLK1, an inverter 130 receiving and inverting the output of inverter 124 when N channel MOS transistor 128 is conductive and supplying as an output a signal SB, an inverter 132 receiving and inverting the signal SB and supplying as an output the resulting signal to an input node of inverter 130 and an inverter 134 receiving and inverting the signal SB.

Phase comparator 54 further includes an N channel MOS transistor 136 being activated in response to the clock signal /ECLK1, an inverter 138 receiving and inverting the clock signal RCLK when N channel MOS transistor 136 is conductive, an inverter 140 receiving and inverting an output of inverter 138 and supplying as an output the resulting signal to an input node of inverter 138, an N channel MOS transistor 142 being activated in response to the clock signal ECLK1, an inverter 144 receiving and inverting an output of inverter 138 when N channel MOS transistor 142 is conductive and supplying as an output a signal SA and an inverter 146 receiving and inverting the signal SA and supplying as an output the resulting signal to an input node of inverter 144.

Phase comparator 54 further includes a 3AND circuit 148 receiving an output of inverter 100 and the signals SC and SB, a switching circuit 152 supplying an output of 3AND circuit 148 as one of the signal DOWN0 and the signal DOWN1 according to the signal SD, a 3AND circuit 150 receiving the output of inverter 100, the output of inverter 134 and the signal SA, and a switching circuit 154 supplying an output of 3AND circuit 150 as one of the signal UP0 and the signal UP1 according to the signal SD.

Figure 6:
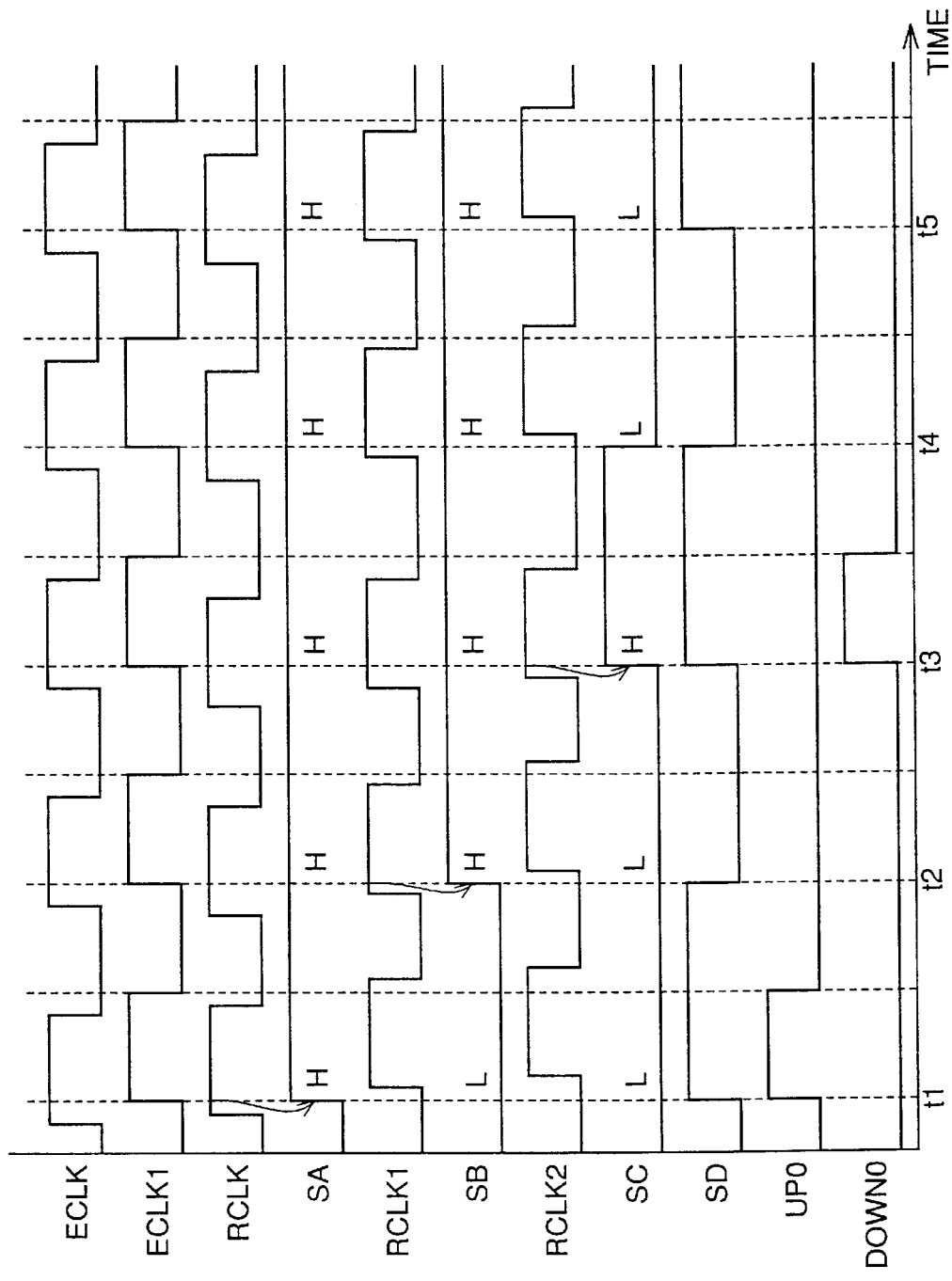
FIG. 6 illustrates waveforms referenced for describing an operation of phase comparator 54.

With reference to FIGS. 5 and 6, at time t1, N channel MOS transistors 108, 122 and 136 are turned to a non conductive state whereas N channel MOS transistors 114, 128 and 142 are turned to a conductive state. At this time the clock signal RCLK is at an H level and the signal SA is pulled up from L level to an H level according thereto. As the clock signals RCLK1 and RCLK2 that are clock signals generated by delaying clock signal RCLK are at an L level, the signals SB and SC are both at an L level. Thus the output of 3AND circuit 148 is at an L level and the signal DOWN0 is at an L level. On the other hand, as the output of 3AND circuit 150 is at an H level while the clock signal ECLK1 is at an H level, the signal UP0 is rendered an H level according thereto.

Next, the clock signal RCLK at time t2 with a phase slightly ahead of that at the time t1 will be described. Clock signals RCLK and RCLK1 are at an H level while the clock signal RCLK2 with a phase still behind is at an L level. At this time the signals SA and SB are at an H level and the signal SC is at an L level. Outputs of 3AND circuits 148 and 150 are both at an L level making the signals DOWN0 and UP0 an L level. When the clock signal ECLK1 rises between the rising edge of the clock signal RCLK1 and the rising edge of the clock signal RCLK2 as at the time t2, the signals DOWN0, DOWN1, UP0 and UP1 are not activated. Such a neutral zone is necessary to prevent a continuous alternate output of the UP signal and the DOWN signal (so called chattering).

At time t3, the phase of the clock signal RCLK goes still ahead that at time t2. As the clock signals RCLK, RCLK1 and RCLK2 all attain an H level, the signals SA, SB and SC are all at an H level. As the phase of the clock signal RCLK leads that of the clock signal ECLK excessively, the signal DOWN0 is activated to increase the amount of delay at the delay line.

At times t4 and t5, as the phases of the clock signal ECLK1 and RCLK are in a neutral zone as at time t2, neither of signals UP0 and DOWN0 are supplied as outputs and the DLL circuit is in a locked state.

Next, an operation of internal clock generation circuit 22 in accordance with the first embodiment of the present invention will be described.

Figure 7:
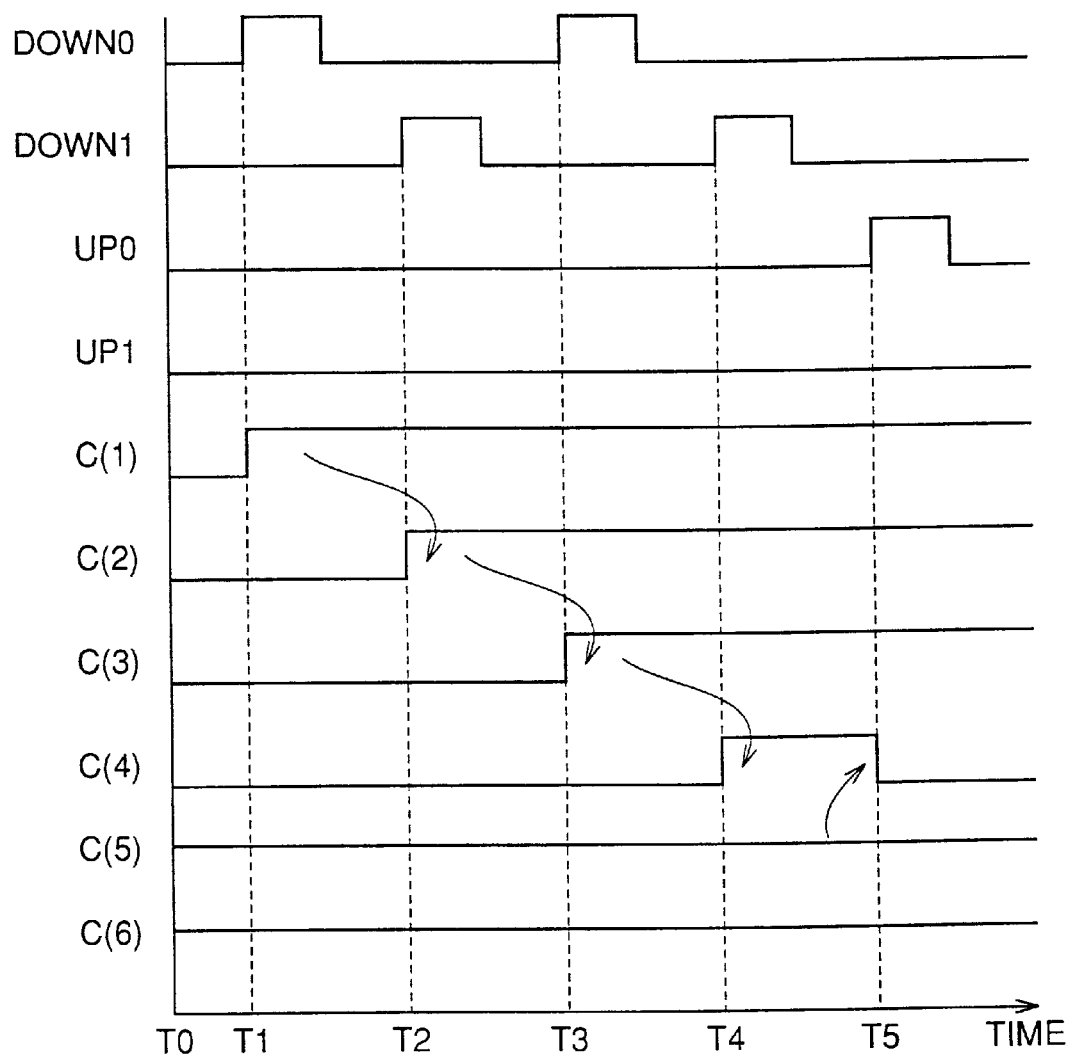
FIG. 7 illustrates waveforms showing a relation between signals DOWN0, DOWN1, UP0 and UP1 supplied as outputs from phase comparator 54 and control signals C(1)–C(6) supplied as outputs from shift register 56.

With reference to FIGS. 3 and 7, both cases where a delay time at clock delaying section 68 increases and decrease will be described. Here, for simplicity, clock delaying section 68 is assumed to include inverters I1–I6.

At time T0, all control signals C(1)–C(6) are assumed to be at an L level. At this time all switches 71.1–71.6 are in an off state. The delay time at clock delaying section 68 is determined by a gate capacitance of inverters I1–I6 and a drain capacitance of N channel MOS transistors 71.1–71.6.

When a minor increase in delay time is required, then at time T1, the signal DOWN0, for example, is activated to an H level. In response thereto, the control signal C(1) rises to an H level because of internal power supply potential Vcc taken in by shift register 73.1. Then switch 71.1 is turned on thereby increasing the delay time at clock delaying section 68 by an amount determined by a capacitance of capacitor 72.1.

When a further increase in delay time is required, then at time T2, the signal DOWN1 is activated to an H level. In response thereto the control signal C(2) rises to an H level. Then switch 71.2 is turned on thereby increasing the delay time at clock delaying section 68 by an amount determined by a capacitance of capacitor 72.2.

Further at time T3, the control signal C(3) attains an H level in response to an activation of signal DOWN0. Then, switch 71.3 is further turned on. Then the delay time at clock delaying section 68 increases by an amount determined by a capacitance of capacitor 72.3.

Further at time T4, the control signal C(4) attains an H level in response to an activation of the signal DOWN1. Then, switch 71.4 is turned on, thereby increasing the delay time at clock delaying section 68 by an amount determined by a capacitance of capacitor 72.4.

On the other hand, to decrease the delay time at clock delaying section 68, the signal UP0 is activated to an H level at time T5.

Then, the control signal C(4) is pulled down to an L level. Then switch 71.4 is turned off and an output node of inverter I4 and capacitor 72.4 which have been connected become disconnected.

By this configuration, the delay time at clock delaying section 68 can be digitally and delicately adjusted in internal clock generation circuit 22 in accordance with the first embodiment of the present invention.

The neutral zone of the phase comparator is determined by the delay time of the delay circuit. When an operating frequency is high and the delay time is required to be controlled with high precision, the range of neutral zone is narrower and conversely when an operating frequency is low and a required precision for the delay time is relatively low, the range of neutral zone is made wider. Then the number of operations of shift register can be decreased and power consumption can be reduced. That the neutral zone range is variable according to an operating frequency is effective in view of power consumption. This procedure can be achieved by increasing the delay time of delay circuits 92, 104, 106, and 120 of phase comparator 54 shown in FIG. 5 when clock frequency becomes lower. For example, the delay time of delay circuits 92, 104, 106 and 120 in the phase comparator can be increased/decreased according to the number of activated control signals C(1)–C(n) by monitoring the number of activated signals among control signals C(1)–C(n) supplied as outputs from shift register 56 shown in FIG. 3.

In such a DLL, an operating frequency range is determined by a maximum amount and a minimum amount of delay at the delay line. In the configuration shown in FIG. 2, for example, if the smallest amount of delay at delay line 52 is 3 ns and delay of delay circuit 58 is 2 ns, the delay from the clock signal ECLK output from clock buffer 20 to the delay line to the clock signal RCLK output via delay line 52 and delay circuit 58 is at least 5 ns. Therefore these clock signals cannot be synchronized if they have a cycle period not more than 5 ns. Thus when the delay time of the delay circuit varies according to process variation, the operating frequency range of the DLL shifts.

The frequency range can be tested by extracting and comparing a portion of the control signal supplied as an output from the shift register as shown in FIG. 2.

At the test, a certain frequency is supplied as an input and a state at the time is supplied as an output. Assume that when the delay time is minimum, outputs of the shift register are all at L level, and that the control signals are turned to an H level from this point sequentially from the control signal C(1) in order to increase the delay time of the delay line. Then an L level signal is given to output buffer 66 when tested two signal lines have different states. Thus the operating frequency range can be tested because the state of the shift register at a certain frequency can be monitored.

With reference again to FIG. 2, if among the control signals supplied as outputs from the shift register of internal clock generation circuit 22, control signals C(1)–C(m) are all at an H level and control signals C(m+k)–C(n) are at an L level when the clock signal is locked, the DLL circuit operates normally and the output of NAND circuit 62 is at an L level during the generation of the internal clock. The test of operation of DLL circuit can be easily performed, by changing the connection of switching circuit 64 through manipulation of the test signal TE supplied as an output in a test mode and taking the information out via output buffer 66.

Second Embodiment

Figure 8:
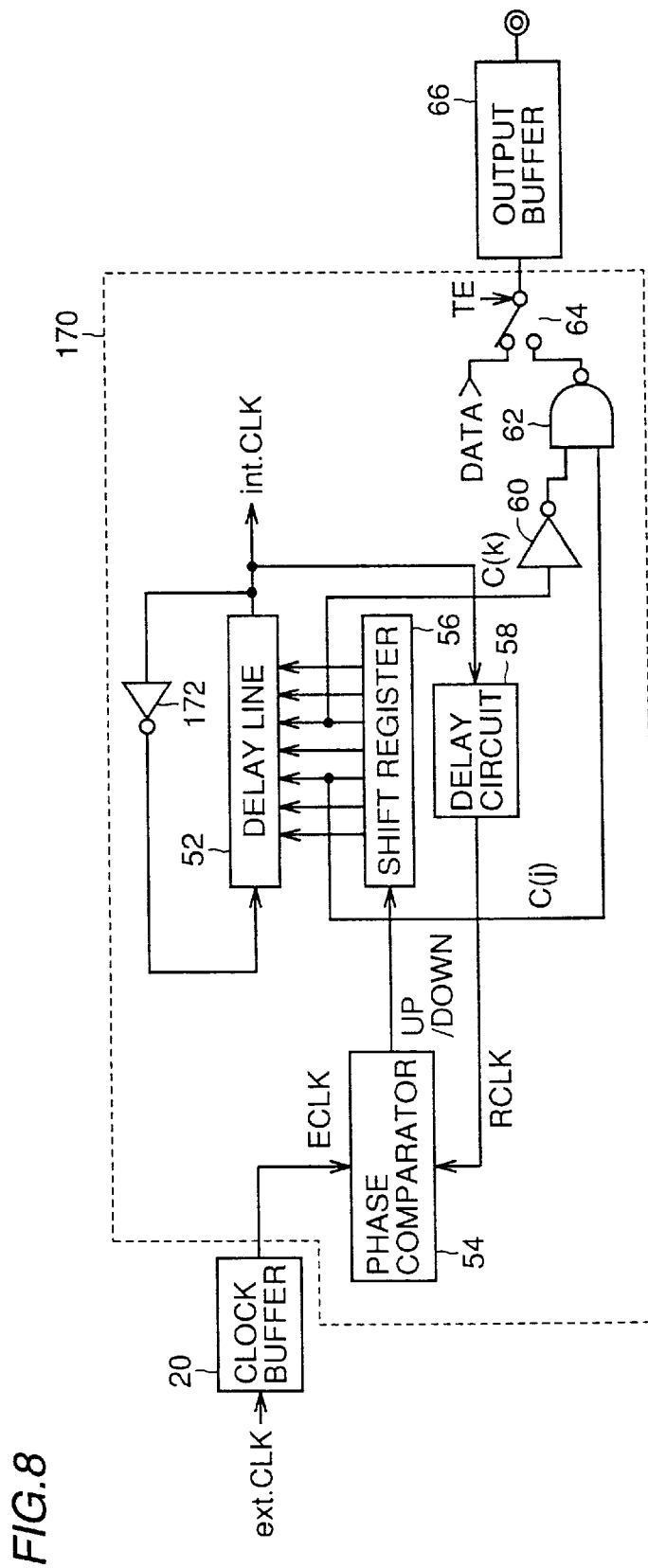
FIG. 8 is a block diagram showing a configuration of an internal clock generation circuit 170 in accordance with a second embodiment, employed in place of internal clock generation circuit 22.

With reference to FIG. 8, an internal clock generation circuit 170 differs from internal clock generation circuit 22 shown in FIG. 2 in that it further includes an inverter 172 receiving and inverting the internal clock signal int. CLK and in that delay line 52 receives and delays an output of inverter 172 instead of the clock signal ECLK. In other respects, internal clock generation circuit 170 is the same with internal clock generation circuit 22 and the same description will not be repeated.

Internal clock generation circuit 170 is a Phase Locked Loop (PLL) constituting a ring oscillator by delay line 52 and inverter 172. In such a PLL circuit, an operation of a digital PLL can be easily confirmed by extracting two output signals of the shift register and confirming their states at NAND circuit 62 as in the first embodiment.

Third Embodiment

In the first and the second embodiments, the output from the shift register is monitored in the test mode. In the third embodiment the operation is confirmed in another configuration.

Figure 9:
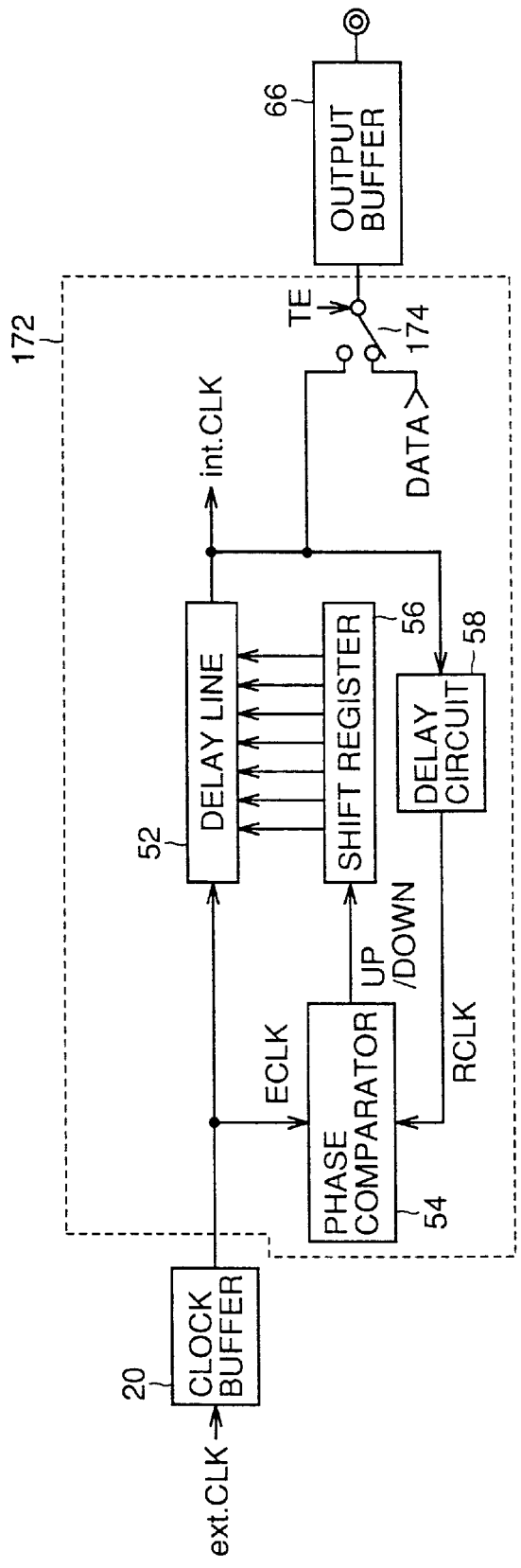
FIG. 9 is a block diagram showing a configuration of an internal clock generation circuit 172 employed in accordance with a third embodiment.

With reference to FIG. 9, an internal clock generation circuit 172 differs from the circuit of the first embodiment in that it includes a switching circuit 174 selectively supplying as an output to output buffer 66 one of the data signal DATA and the internal clock signal int. CLK according to the test signal TE, in place of inverter 60, NAND circuit 62 and switching circuit 64 employed in the configuration of internal clock generation circuit 22 shown in FIG. 2. As internal clock generation circuit 172 is the same with internal clock generation circuit 22 shown in FIG. 2 in other respect, the same description will not be repeated.

Internal clock generation circuit 172 (in this case a DLL circuit) is tested by monitoring of the internal clock signal int. CLK supplied as an output via output buffer 66 through switching according to the test signal TE. At the operation confirmation test, the clock frequency supplied as an input from an external source is changed and a corresponding change in the internal clock signal is monitored.

With such a configuration, the operation of the internal clock generation circuit such as a built in DLL circuit can be easily confirmed in the third embodiment.

Fourth Embodiment

In the third embodiment, the internal clock generation circuit is a DLL circuit whereas in the fourth embodiment the internal clock generation circuit is a PLL circuit.

Figure 10:
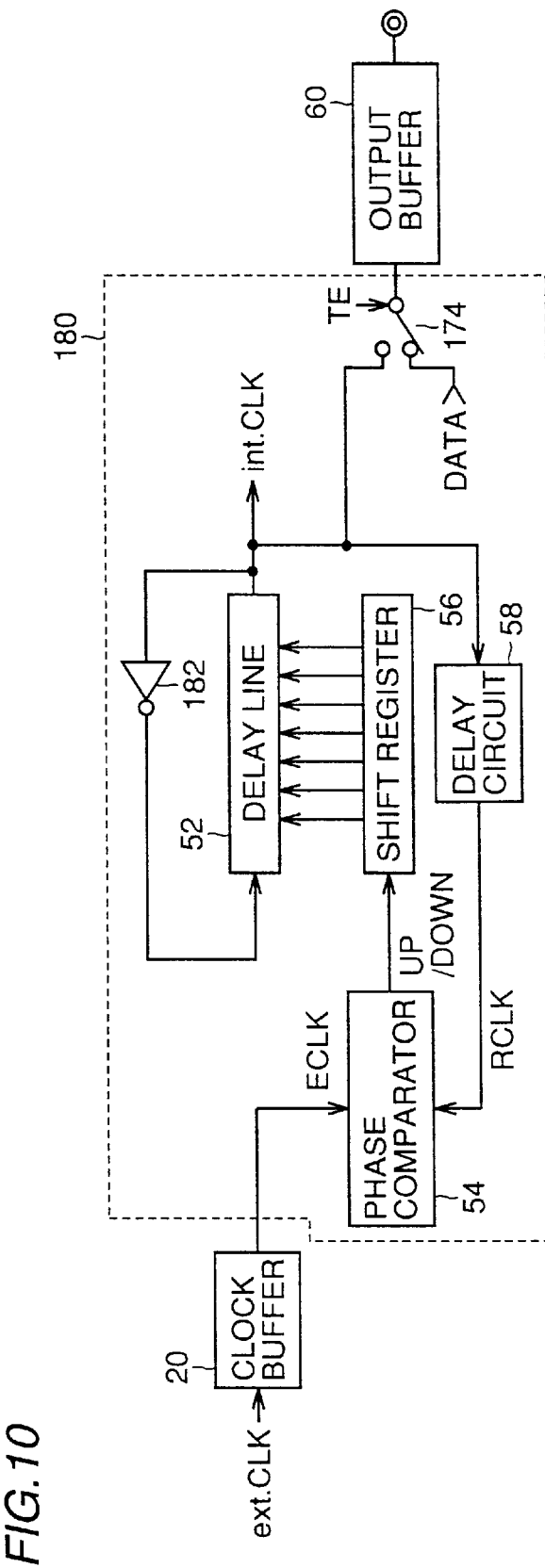
FIG. 10 is a block diagram showing a configuration of an internal clock generation circuit 180 in accordance with a fourth embodiment.

With reference to FIG. 10, an internal clock generation circuit 180 differs from internal clock generation circuit 172 shown in FIG. 9 in that it further includes an inverter 182 receiving and inverting the internal clock signal int. CLK and in that delay line 52 receives and delays an output signal from inverter 182 instead of the clock signal ECLK. As internal clock generation circuit 180 has the same configuration with that of internal clock generation circuit 172 in other respects, the same description will not be repeated.

With such a configuration, an operation confirmation test can be performed for the internal clock generation circuit such as a PLL circuit.

Fifth Embodiment

Figure 11:
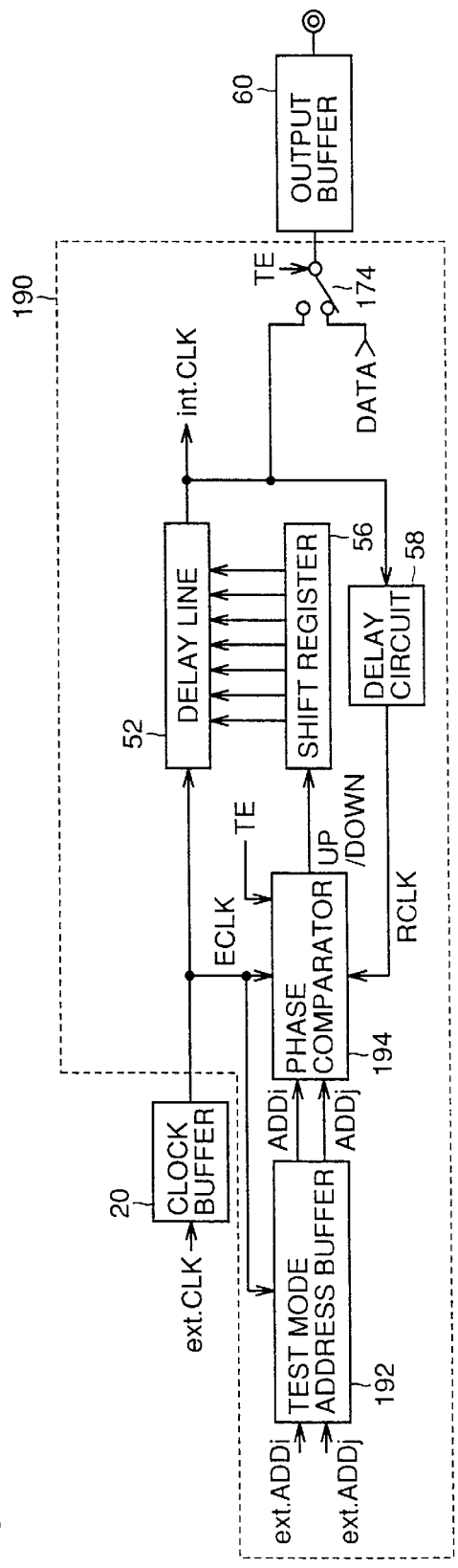
FIG. 11 is a block diagram showing a configuration of an internal clock generation circuit 190 employed in accordance with a fifth embodiment.

With reference to FIG. 11, an internal clock generation circuit 190 is different from internal clock generation circuit 172 in that it further includes a TEST MODE address buffer 192 receiving external address signals ext. ADDi and ext. ADDj and supplying as outputs the internal signals ADDi and ADDj in synchronization with the clock signal ECLK and in that it includes a phase comparator 194 receiving the internal signals ADDi and ADDj and clock signals ECLK and RCLK according to the test signal TE and supplying as outputs control signals UP/DOWN (UP0, UP1, DOWN0 and DOWN1), in place of phase comparator 54 employed in internal clock generation circuit 172 shown in FIG. 9. As the internal clock generation circuit 190 has the same configuration with that of internal clock generation circuit 172 in other respects, the same description will not be repeated.

Figure 12:
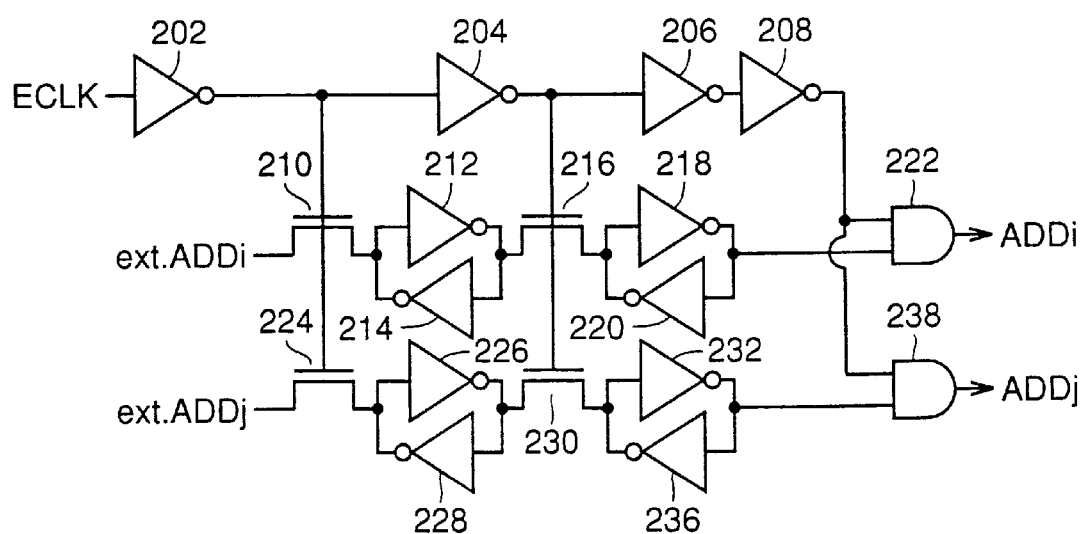
FIG. 12 is a circuit diagram showing a configuration of a TEST MODE address buffer 192.

With reference to FIG. 12, TEST MODE address buffer 192 includes an inverter 202 receiving and inverting the clock signal ECLK, an inverter 204 receiving and inverting an output of inverter 202 and inverters 206 and 208 connected in series and receiving an output of inverter 204.

TEST MODE address buffer 192 further includes an N channel MOS transistor 210 having a gate receiving the output of inverter 202, an inverter 212 receiving and inverting the external address signal ext. ADDi when N channel MOS transistor 210 is conductive, an inverter 214 receiving and inverting an output of inverter 212 and supplying the inverted signal to an input node of inverter 212, an N channel MOS transistor 216 having a gate receiving the output of inverter 204, an inverter 218 receiving and inverting the output of inverter 212 when N channel MOS transistor 216 is conductive, an inverter 220 receiving and inverting an output of inverter 218 and supplying the inverted signal to an input node of inverter 218 and an AND circuit 222 receiving an output of inverter 208 and the output of inverter 218 and supplying as an output the internal signal ADDi.

TEST MODE address buffer 192 further includes an N channel MOS transistor 224 having a gate receiving the output of inverter 202, an inverter 226 receiving and inverting the external address signal ext. ADDj when N channel MOS transistor 224 is conductive, an inverter 228 receiving and inverting an output of inverter 226 and supplying the inverted signal to an input node of inverter 226, an N channel MOS transistor 230 having a gate receiving the output of inverter 204, an inverter 232 receiving and inverting the output of inverter 226 when N channel MOS transistor 230 is conductive, an inverter 236 receiving and inverting an output of inverter 232 and supplying the inverted signal to an input node of inverter 232 and an AND circuit 238 receiving the output of inverter 208 and the output of inverter 232 and supplying as an output the internal signal ADDj.

Figure 13:
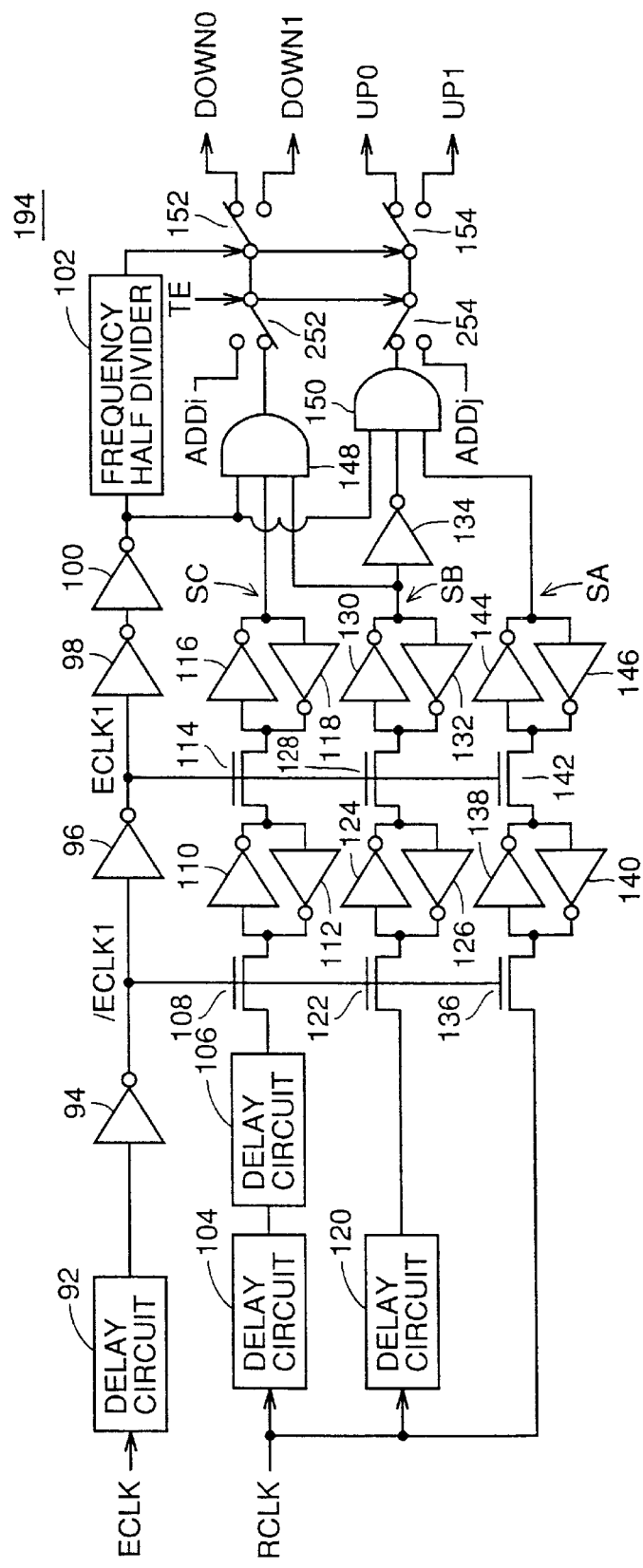
FIG. 13 is a circuit diagram showing a configuration of a phase comparator 194 shown in FIG. 11.

With reference to FIG. 13, phase comparator 194 differs from phase comparator 54 shown in FIG. 5 in that it further includes a switching circuit 252 selectively supplying as an output one of the internal signal ADDi and an output of 3AND circuit 148 to switching circuit 152 according to the test signal TE and a switching circuit 254 selectively supplying as an output one of the internal signal ADDj and an output of 3AND circuit 150 to switching circuit 154 according to the test signal TE. As phase comparator 194 has the same configuration with phase comparator 54 in other respects, the same description will not be repeated.

Figure 14:
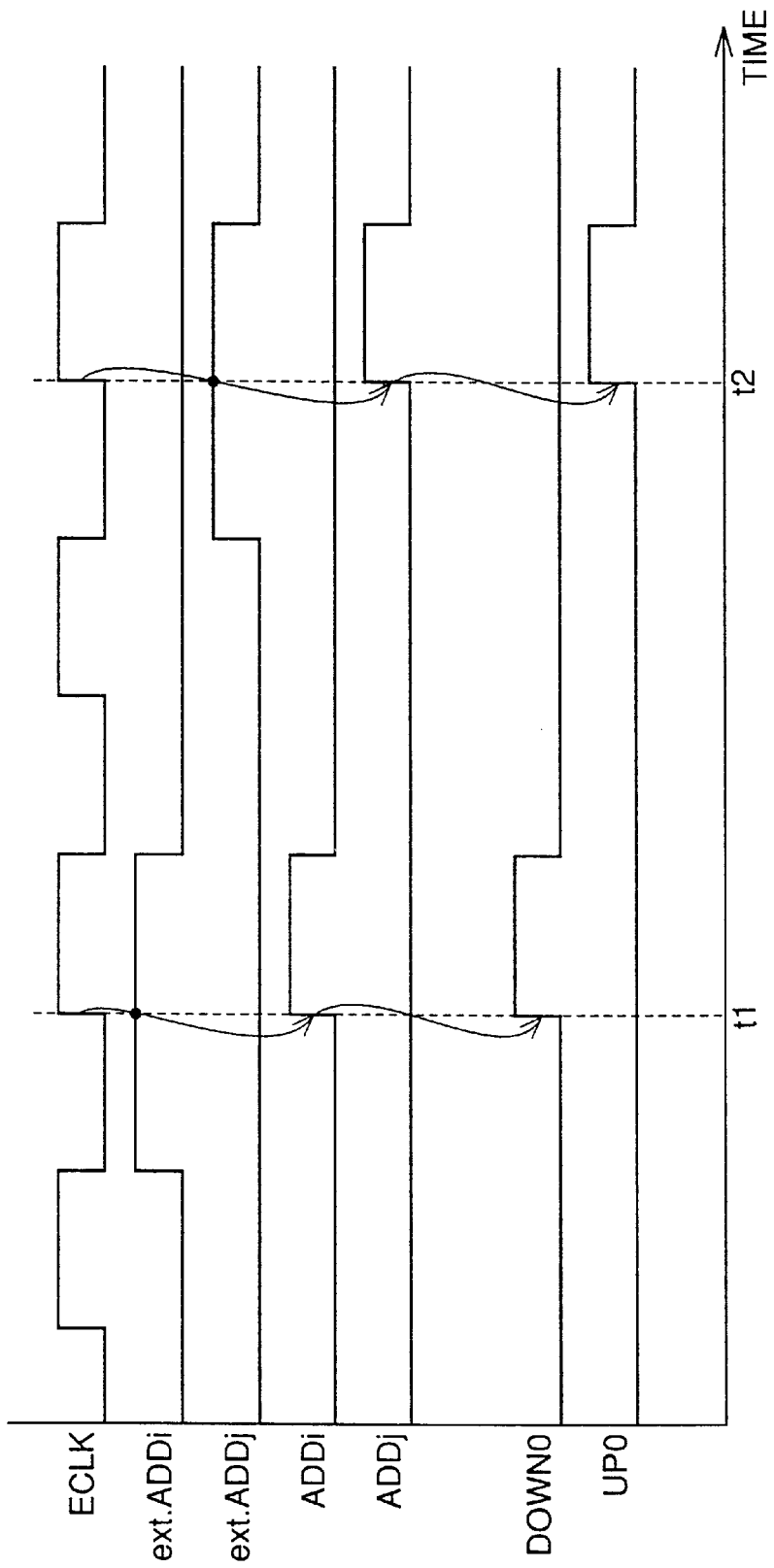
FIG. 14 illustrates waveforms referenced for describing operations of TEST MODE address buffer 192 and phase comparator 194 shown in FIG. 11.

With reference to FIG. 14, when the external address signal ext. ADDi is at an H level at the rising edge of the clock signal ECLK as shown at time t1, the external address signal ext. ADDi is taken into TEST MODE address buffer 192 and attains an H level while the clock signal ECLK is at an H level. As switching circuit 252 shown in FIG. 13 is switched according to the test mode signal TE such that it sends the internal signal ADDi to switching circuit 152, the signal DOWN0 is turned to an H level according thereto in the test mode.

Then, the delay time of the delay line increases because of the signal DOWN0 attaining an H level in response to the address signal ext. ADDi supplied from an external source.

On the other hand, when the external address signal ext. ADDj attains an H level at the rising edge of the clock signal ECLK as shown at time t2, the internal signal ADDj is turned to an H level and signal UP0 is turned to an H level in response thereto. Thus the delay time of delay line decreases when the external address signal ext. ADDj attains an H level thereby making the internal signal UP0 an H level.

With the above described configuration, the amount of delay at the delay line of the internal clock generation circuit such as a DLL circuit can be externally changed and an operation of the DLL circuit can be confirmed through the monitoring of variable range of the amount of the delay.

Sixth Embodiment

Figure 15:
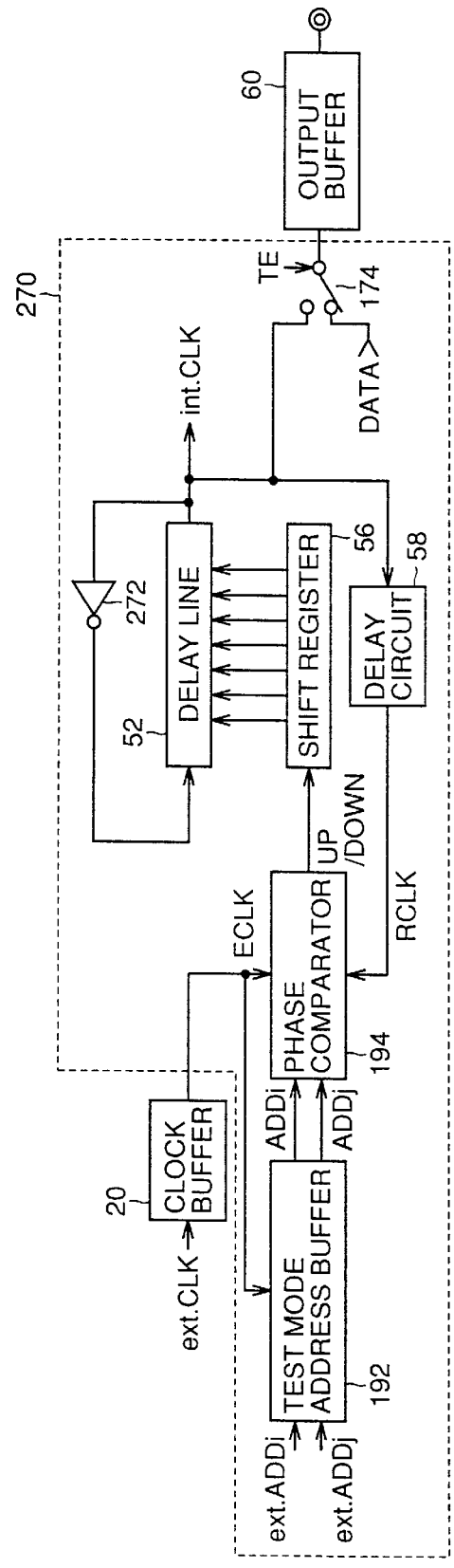
FIG. 15 is a circuit diagram showing a configuration of an internal clock generation circuit 270 employed in accordance with a sixth embodiment.

With reference to FIG. 15, an internal clock generation circuit 270 differs from internal clock generation circuit 190 shown in FIG. 11 in that it further includes an inverter 272 receiving and inverting the internal clock signal int. CLK and in that delay line 52 receives and delays an output of inverter 272 and supplies as an output the internal clock signal int. CLK. Internal clock generation circuit 270 has the same configuration with internal clock generation circuit 190 in other respects and the same description will not be repeated.

With this configuration, even in a PLL circuit, the amount of delay of the delay line is externally changeable. Hence an operation of the PLL circuit can be confirmed by the monitoring of the frequency of the internal clock signal.

Seventh Embodiment

Figure 16:
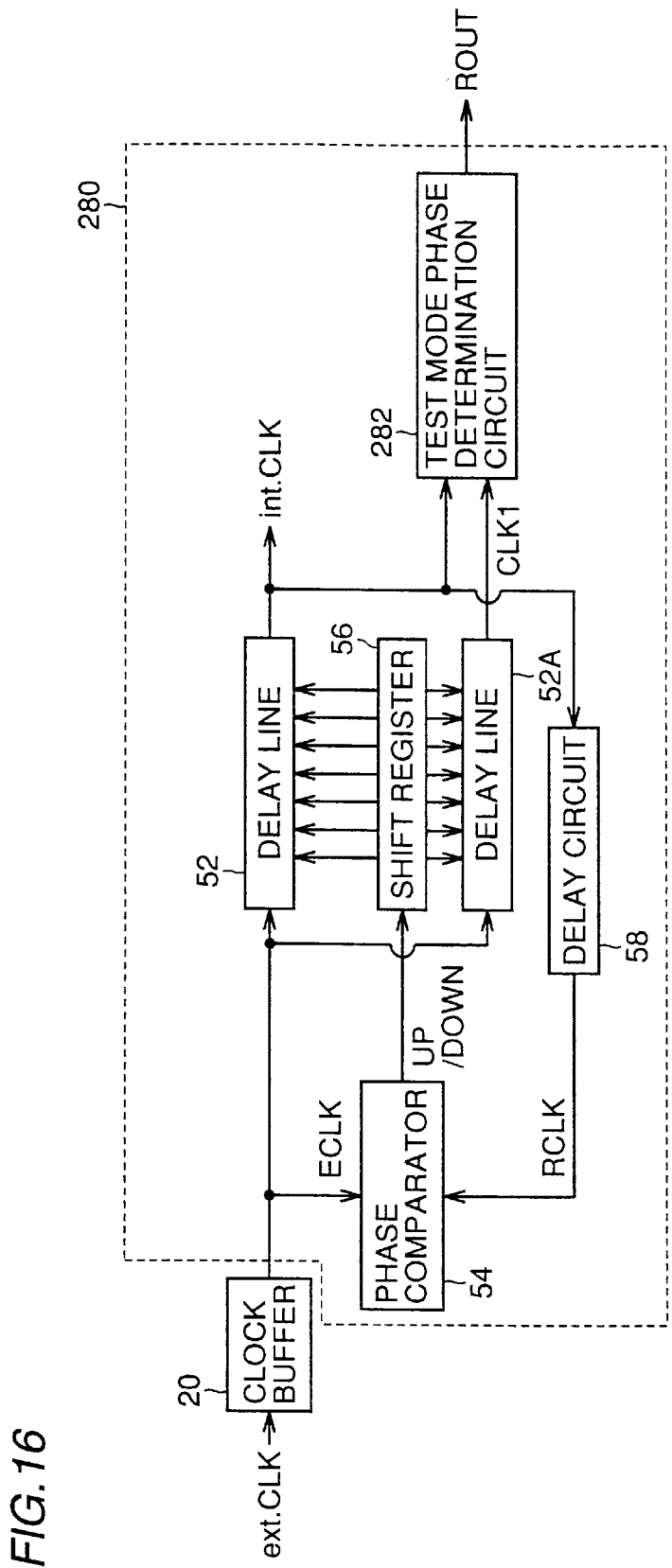
FIG. 16 is a block diagram showing a configuration of an internal clock generation circuit 280 employed in accordance with a seventh embodiment.

With reference to FIG. 16, an internal clock generation circuit 280 includes a delay line 52A having the same configuration with delay line 52 receiving and delaying the clock signal ECLK and supplying as an output the clock signal CLK1, and a TEST MODE phase determination circuit 282 comparing the phases of the internal clock signal int. CLK and the clock signal CLK1 and supplying as an output the resulting signal ROUT, in place of inverter 60, NAND circuit 62 and switching circuit 64 in the configuration of internal clock generation circuit 22 shown in FIG. 2.

Internal clock generation circuit 280 has the same configuration with internal clock generation circuit 22 shown in FIG. 2 in other respects and the same description will not be repeated.

Figure 17:
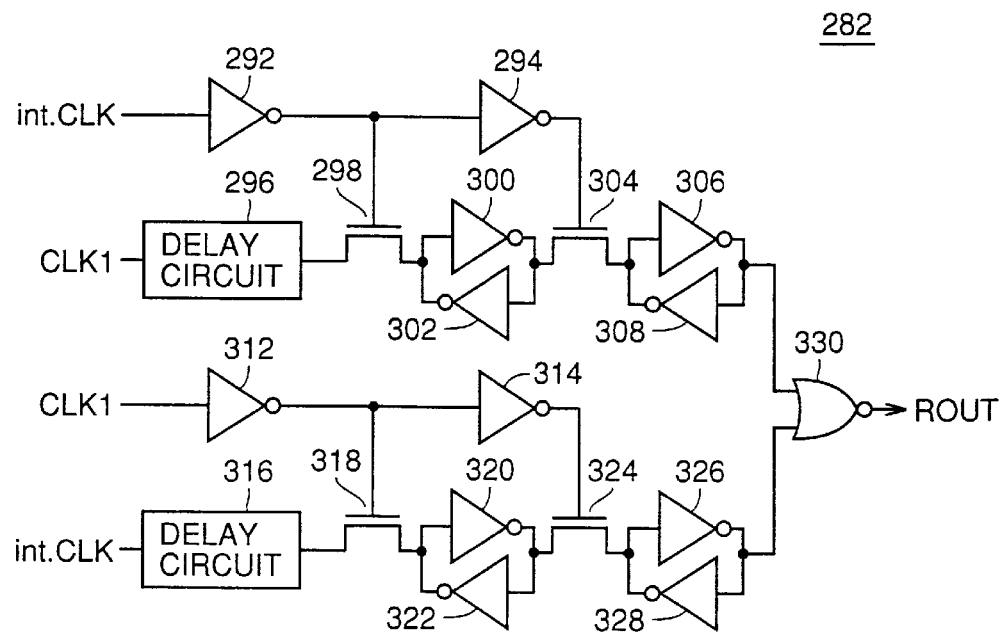
FIG. 17 is a circuit diagram showing a configuration of TEST MODE phase determination circuit 282.

With reference to FIG. 17, TEST MODE phase determination circuit 282 includes an inverter 292 receiving and inverting the internal clock signal int. CLK, an inverter 294 receiving and inverting an output of inverter 292, a delay circuit 296 receiving and delaying the clock signal CLK1 supplied as an output from the delay line 52A, an N channel MOS transistor 298 having a gate receiving an output of inverter 292, an inverter 300 receiving and inverting an output of delay circuit 296 when N channel MOS transistor 298 is conductive, an inverter 302 receiving an output of inverter 300 and supplying as an output to an input node of inverter 300, an N channel MOS transistor 304 having a gate receiving an output of inverter 294, an inverter 306 receiving and inverting an output of inverter 300 when N channel MOS transistor 304 is conductive and an inverter 308 receiving and inverting an output of inverter 306 and supplying as an output the resulting signal to an input node of inverter 306.

TEST MODE phase determination circuit 282 further includes an inverter 312 receiving and inverting the clock signal CLK1, an inverter 314 receiving and inverting an output of inverter 312, a delay circuit 316 receiving and delaying the internal clock signal int. CLK, an N channel MOS transistor 318 having a gate receiving an output of inverter 312, an inverter 320 receiving and inverting an output of delay circuit 316 when N channel MOS transistor 318 is conductive, an inverter 322 receiving and inverting an output of inverter 320 and supplying as an output the resulting signal to an input node of inverter 320, an N channel MOS transistor 324 having a gate receiving an output of inverter 314, an inverter 326 receiving and inverting an output of inverter 320 when N channel MOS transistor 324 is conductive, an inverter 328 receiving and inverting an output of inverter 326 and supplying as an output the resulting signal to an input node of inverter 326 and an NOR circuit 330 receiving the output of inverter 306 and the output of inverter 326 and supplying as an output the signal ROUT.

Figure 18:
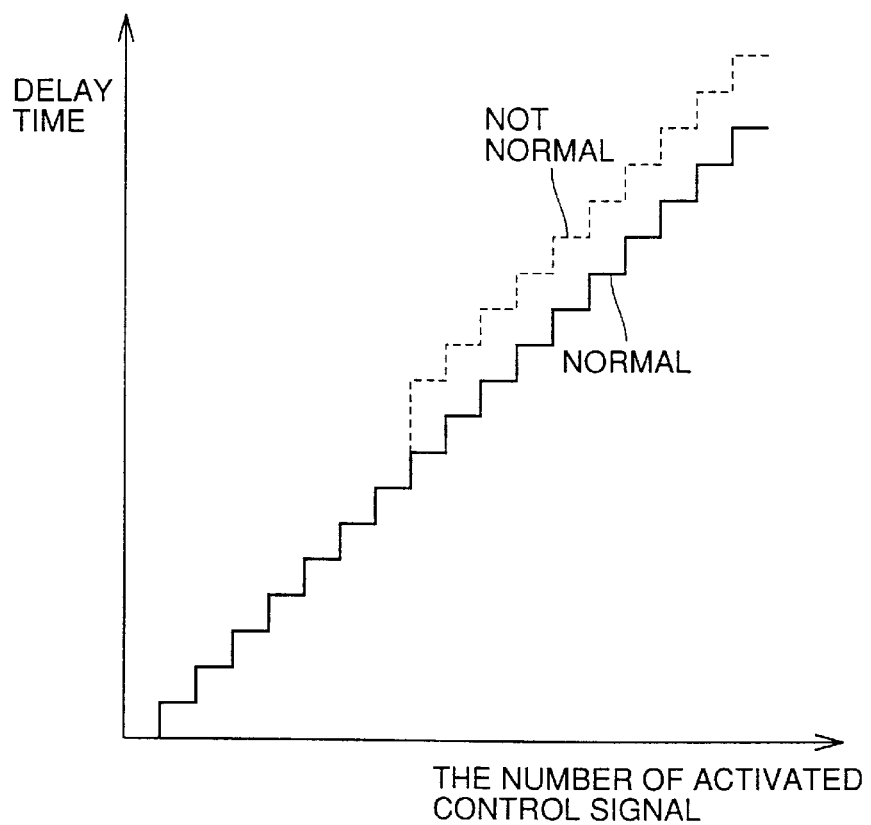
FIG. 18 is a diagram referenced for describing an example in which a problem occurs in a delay line in accordance with the seventh embodiment.

In FIG. 18, a number of control signals attaining an H level among control signals C(1)–C(n) supplied as outputs from the shift register to the delay line is shown along the horizontal axis and the delay time of the delay line in each case is shown along the vertical axis.

The internal clock generation circuit employed in the seventh embodiment compares outputs of two identical delay lines. The delay line increases the delay time stepwise according to the number of activated control signals from the shift register. The increase in the delay time, however, sometimes becomes larger than the predetermined amount of time period, for example, when a capacitance of only one capacitor in the section which controls the amount of delay of the delay line becomes large. Such a problem seldom occurs in two delay lines at the same time. Therefore the delay lines can be tested by comparison of the signals on two delay lines. If no problem is found in two delay lines, the signal with the same phase is supplied to the TEST MODE phase determination circuit. If the delay time at the inverter in FIG. 17 is negligible, the signal ROUT attains an H level when the phase difference between two signals is within the range of delay time of delay circuit whereas the signal ROUT attains an L level when the phase difference between two clock signals is larger than the delay time of the delay circuit.

With this configuration, a unsatisfactory behavior of the DLL circuit which is very hard to detect can be found.

Eighth Embodiment

Figure 19:
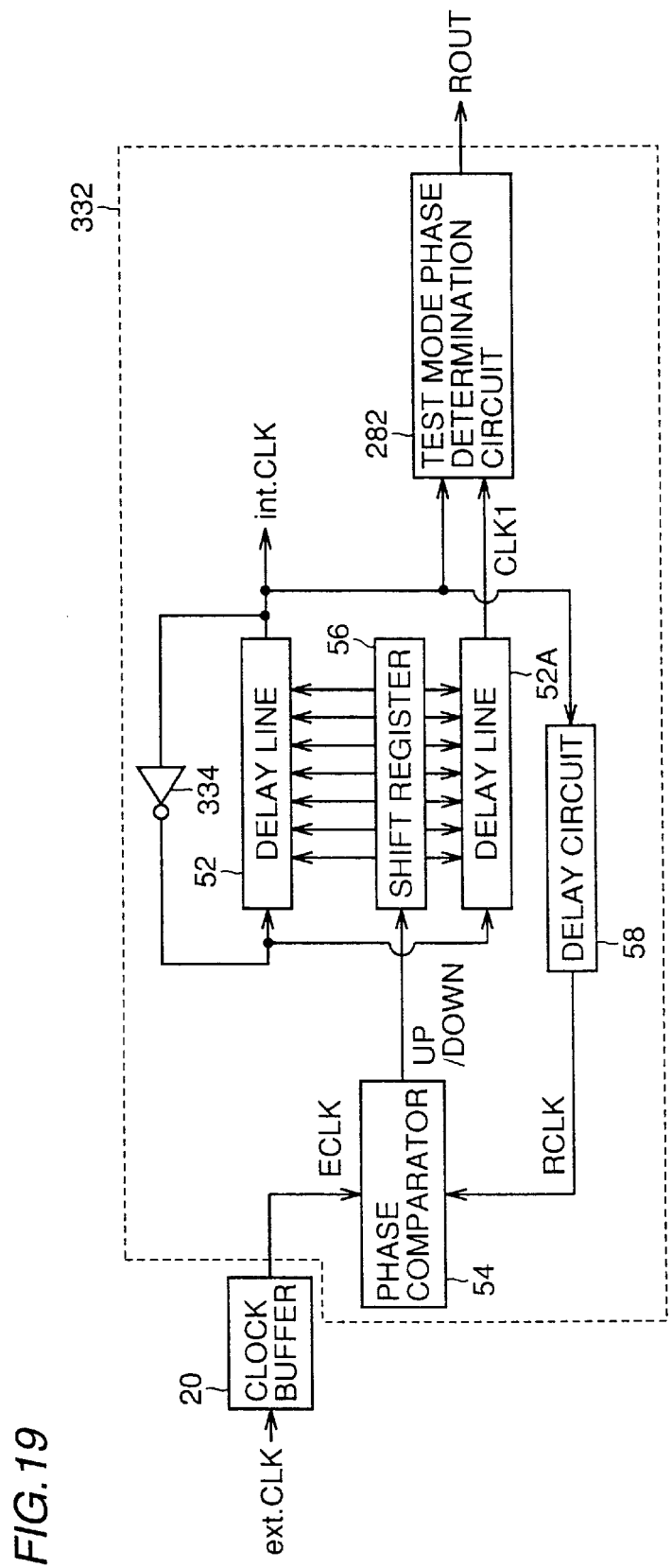
FIG. 19 is a circuit diagram showing a configuration of an internal clock generation circuit 332 employed in an eighth embodiment.
Figure 20:
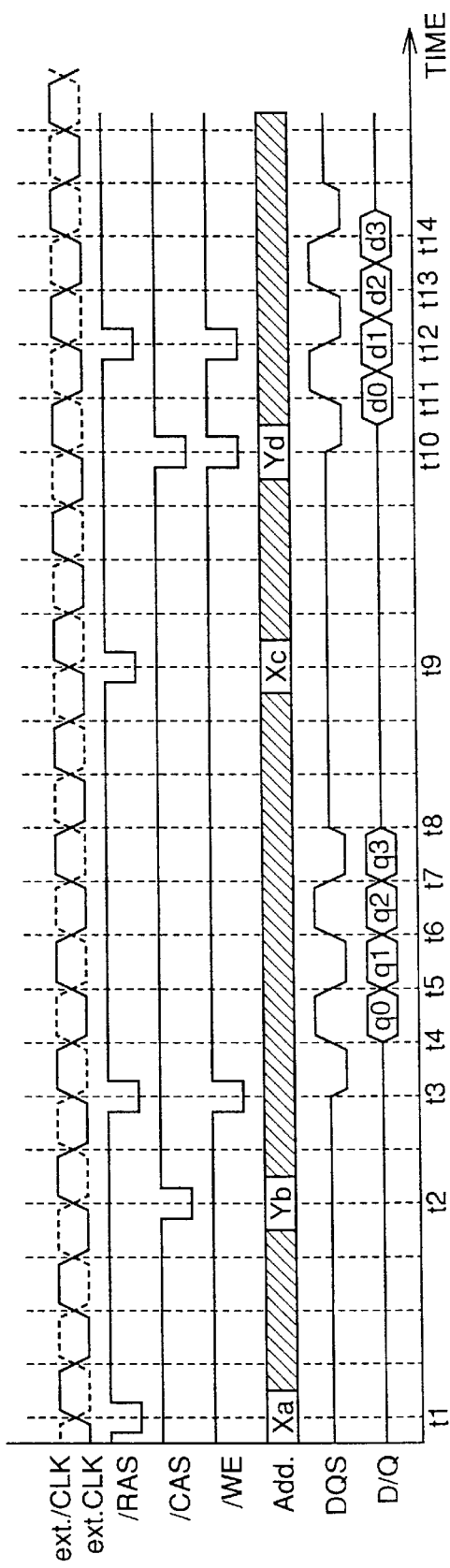
FIG. 20 illustrates waveforms referenced for describing an operation of the DDR SDRAM upon being accessed.
Figure 21:
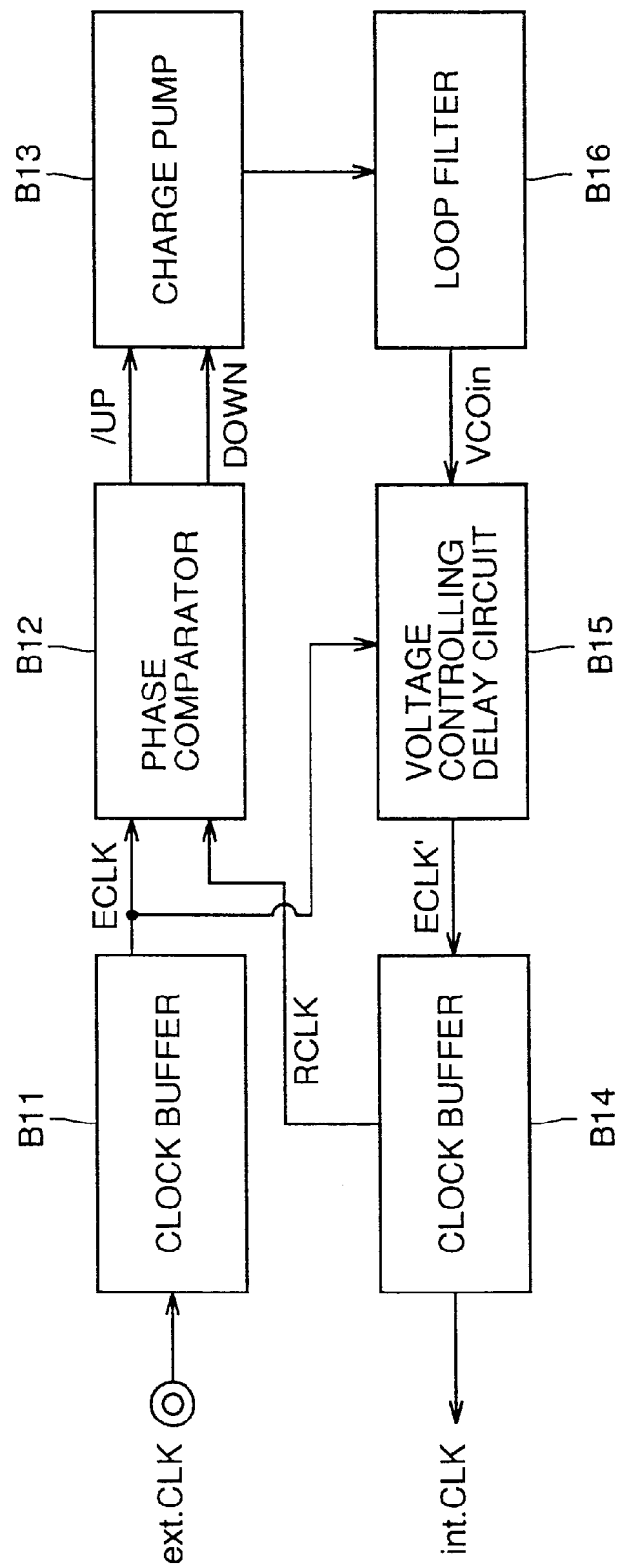
FIG. 21 is a block diagram showing a configuration of the conventional DLL circuit.
Figure 22:
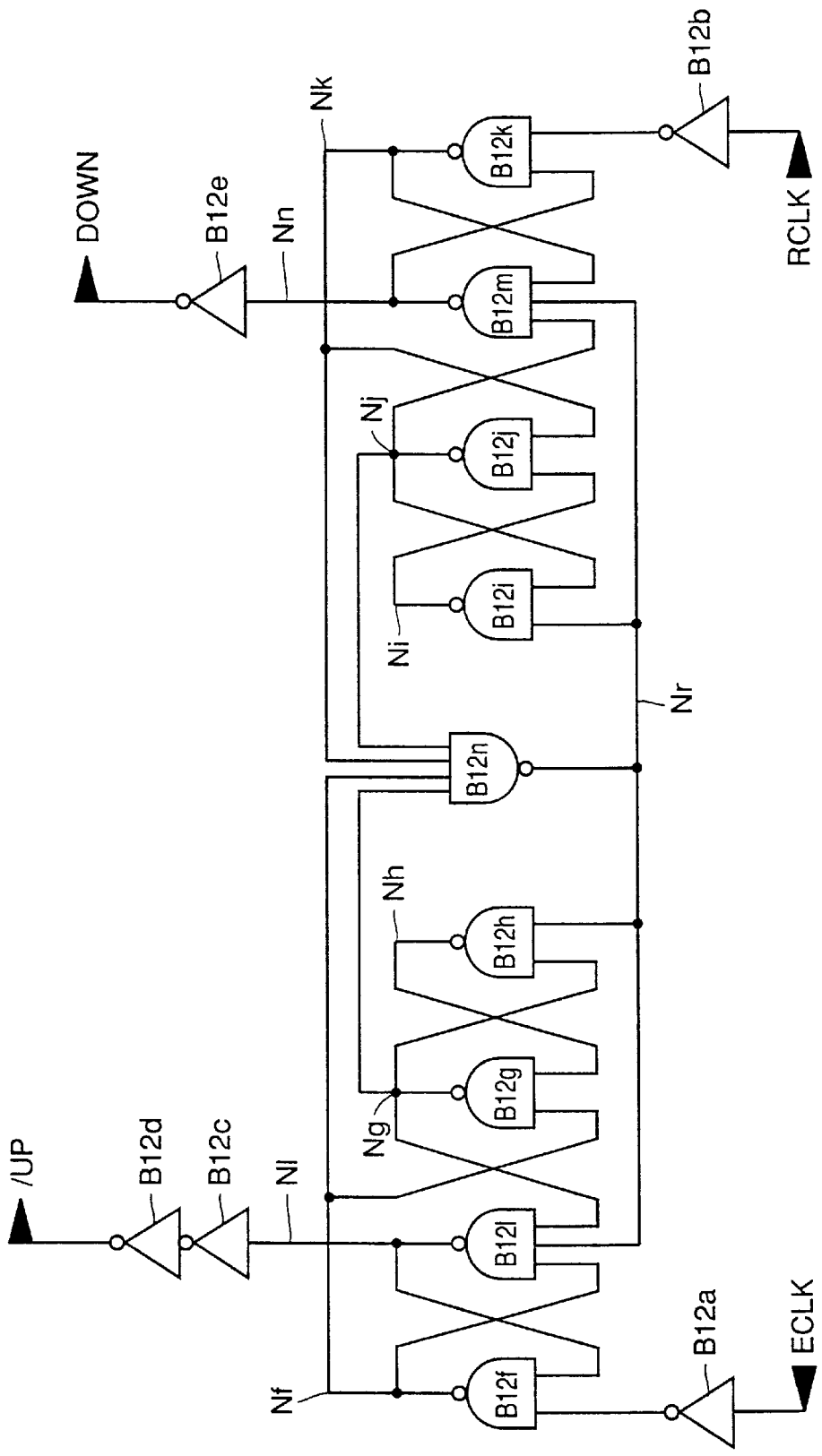
FIG. 22 is a circuit diagram showing a configuration of phase comparator B12 shown in FIG. 21.
Figure 23:
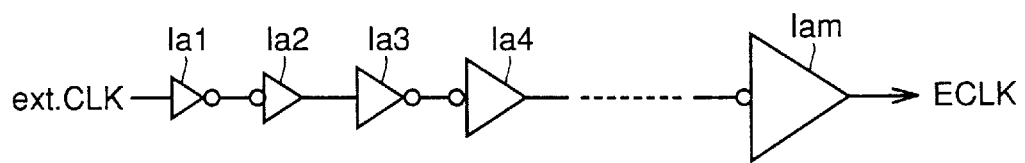
FIG. 23 is a circuit diagram showing a configuration of clock buffer B11 shown in FIG. 21.
Figure 24:
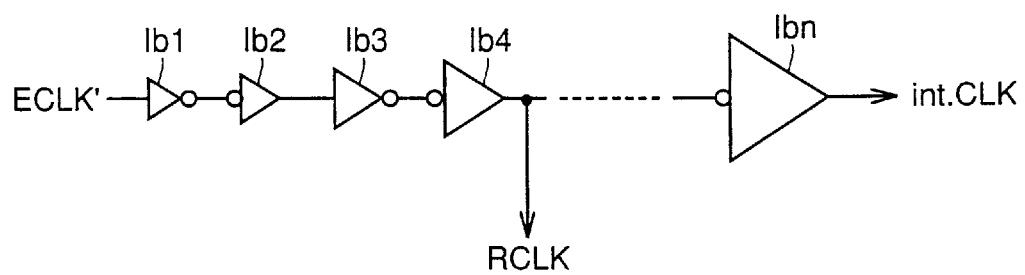
FIG. 24 is a circuit diagram showing a configuration of clock buffer B14 shown in FIG. 21.
Figure 25:
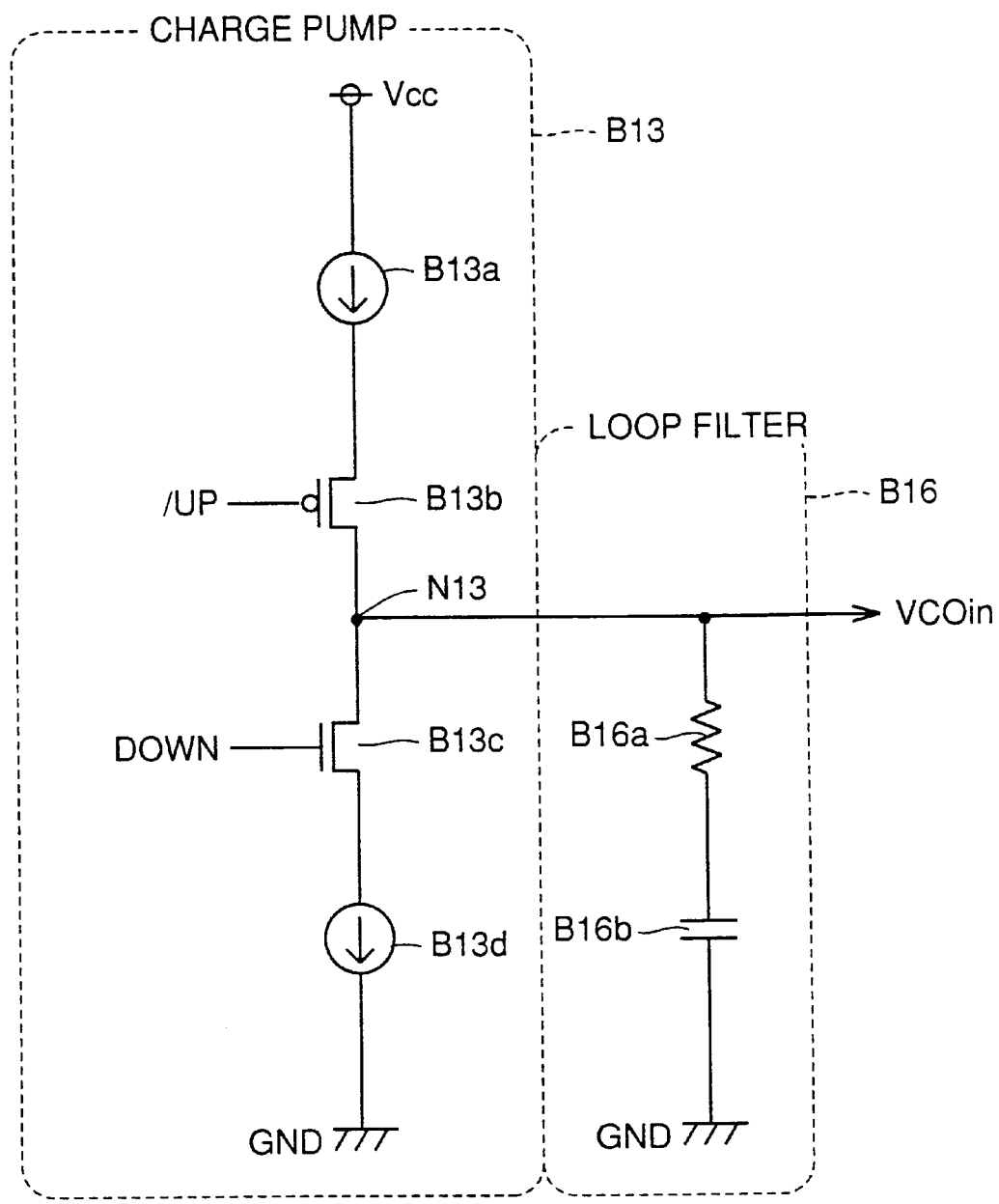
FIG. 25 is a circuit diagram showing configurations of charge pump B13 and loop filter B16 shown in FIG. 21.
Figure 26:
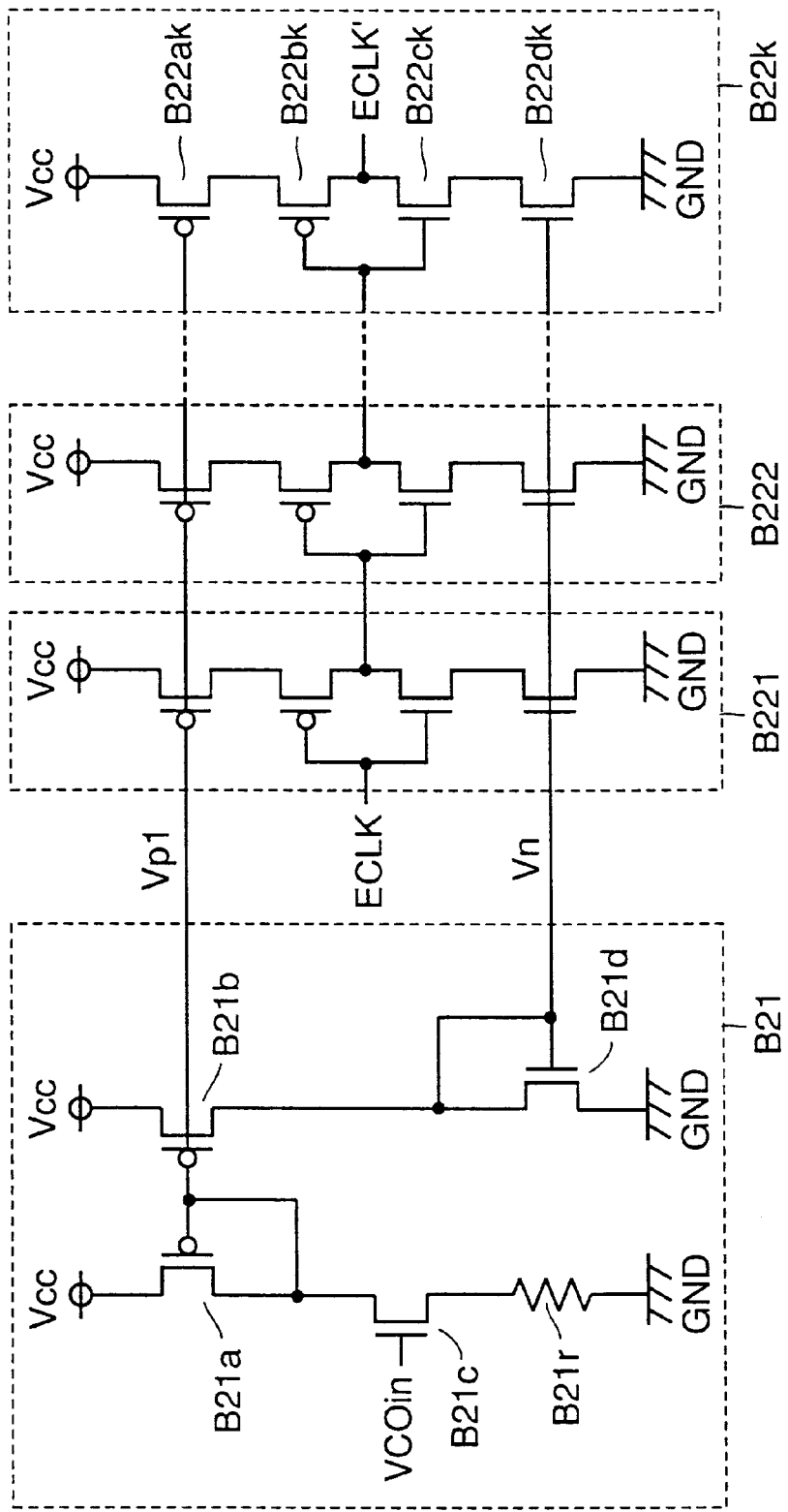
FIG. 26 is a circuit diagram showing a configuration of voltage controlling delay circuit B15 shown in FIG. 21.
Figure 27:
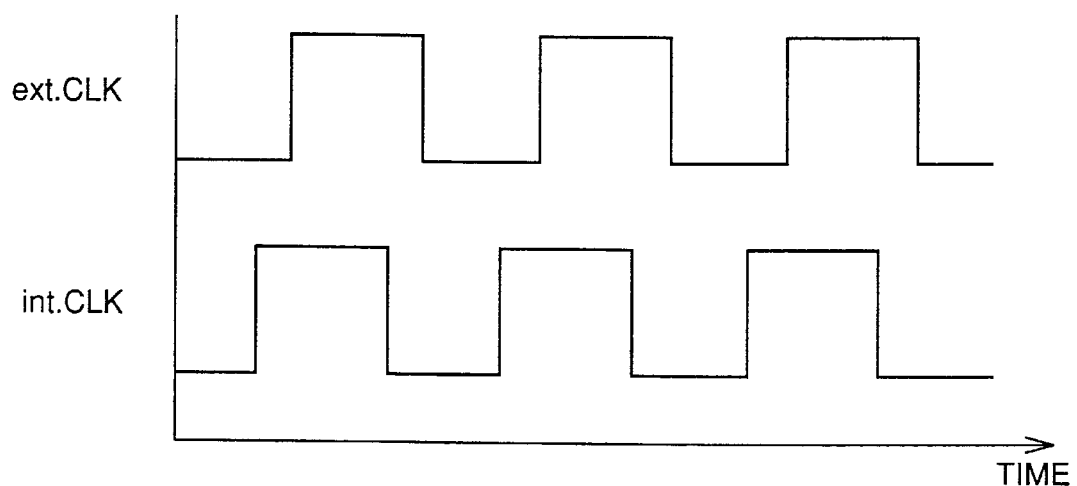
FIG. 27 illustrates waveforms referenced for describing a relation between the external clock signal ext. CLK and the internal clock signal int. CLK shown in FIG. 21.

With reference to FIG. 19, an internal clock generation circuit 332 differs from internal clock generation circuit 280 shown in FIG. 16 in that it further includes an inverter 334 receiving and inverting the internal clock signal int. CLK and in that delay line 52 receives and delays an output of inverter 334 and supplies as an output the internal clock signal int. CLK. Internal clock generation circuit 332 has the same configuration with internal clock generation circuit 280 in other respects and the same description will not be repeated.

With this configuration a unsatisfactory behavior of the PLL circuit which is very difficult to detect can be found.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   an internal clock generation circuit for generating an internal clock in synchronization with a reference clock, including,
      a delay circuit generating said internal clock by delaying a first clock correlating with said reference clock according to an n-bit (n: an integer of at least 2) control signal,
      a phase comparison circuit comparing phases of said internal clock and said reference clock, and
      a shift register outputting said control signal according to a result of comparison at said phase comparison circuit, said shift register shifting position of a transition bit in said control signal according to said result of comparison, when lower m th bit (m: an integer at least 0 and at most said n) among said n bits of said control signal has a first logical value and a bit of said control signal adjacent the m th bit has a second logical value, the m th bit from the least significant bit is said transition bit; and
      a determination circuit, if a predetermined expected position of said transition bit is the i-th bit (i: an integer at least 1 and at most said n−1) from the least significant bit of said control signal for normal generation of said internal clock, for producing result data by determining whether a predetermined j th bit (j: an integer at least 0 and less than said i) from the least significant bit of said control signal has said first logical value and a predetermined k th bit (k: an integer more than said i and at most said n) of said control signal has said second logical value.

2. The semiconductor device according to claim 1, further comprising:
   a data terminal for receiving/transmitting from/to an external source predetermined data at a normal operation; and
   a switching circuit for supplying to said data terminal an output of said determination circuit according to a test mode signal activated when an operation of said internal clock generation circuit is confirmed.

3. The semiconductor device according to claim 1, wherein said determination circuit includes a logic gate outputting an inverted AND of an inverted logical value of said k th bit and said j th bit.

4. The semiconductor device according to claim 1, wherein
   said delay circuit includes,
      a plurality of delay elements connected in series,
      a plurality of capacitance elements each corresponding to an output node of each of said delay elements, and
      a plurality of switching circuits each connecting an output node of each of said delay elements and a corresponding one of said capacitance element according to a corresponding bit signal of said control signal.

5. The semiconductor device according to claim 1, wherein
   said internal clock generation circuit further includes a transmit section supplying to said delay circuit said reference clock as said first clock and operates as a digital DLL circuit.

6. The semiconductor device according to claim 5, further comprising a semiconductor memory device for receiving/transmitting storage data in synchronization with said internal clock.

7. The semiconductor device according to claim 1, wherein
   said internal clock generation circuit further includes an inversion circuit for inverting said internal clock and outputting said first clock and operates as a digital PLL circuit.

8. The semiconductor device according to claim 7, further comprising a semiconductor memory device for receiving/transmitting storage data in synchronization with said internal clock.

9. A semiconductor device comprising:
   an internal clock generation circuit for generating an internal clock in synchronization with a reference clock, including,
      a first delay circuit generating said internal clock by delaying a first clock correlating with said reference clock according to an n-bit (n: an integer at least 2) control signal,
      a phase comparison circuit comparing phases of said internal clock and said reference clock, and
      a shift register outputting said control signal according to result of comparison at said phase comparison circuit, said shift register shifting position of a transition bit in said control signal according to said result of comparison, when lower m th bit (m: an integer at least 0 and at most said n) among said n bits of said control signal has a first logical value and a bit of said control signal adjacent the m th bit has a second logical value, the m th bit from the least significant bit is said transition bit;
   a first data terminal for receiving/transmitting from/to an external source predetermined data at a normal operation; and
   a switching circuit for outputting to said first data terminal said internal clock according to a test mode signal activated when an operation of said internal clock generation circuit is confirmed.

10. The semiconductor device according to claim 9, further comprising a second data terminal for receiving/transmitting from/to an external source predetermined data at the normal operation, wherein
   said phase comparison circuit includes
      an output switching circuit outputting an input signal on said second data terminal instead of said result of comparison according to the test mode signal activated when the operation of said internal clock generatior circuit is confirmed.

11. The semiconductor device according to claim 9, wherein
   said internal clock generation circuit further includes a transmit section supplying to said delay circuit said reference clock as said first clock and operates as a digital DLL circuit.

12. The semiconductor device according to claim 11, further comprising a semiconductor memory device for receiving/transmitting storage data in synchronization with said internal clock.

13. The semiconductor device according to claim 9, wherein
   said internal clock generation circuit further includes an inversion circuit for inverting said internal clock and outputting said first clock and operates as a digital PLL circuit.

14. The semiconductor device according to claim 13, further comprising a semiconductor memory device for receiving/transmitting storage data in synchronization with said internal clock.

15. A semiconductor device comprising:
an internal clock generation circuit for generating an internal clock in synchronization with a reference clock, including,
  a first delay circuit generating said internal clock by delaying a first clock correlating with said reference clock according to an n-bit (n: an integer larger than 2) control signal,
  a second delay circuit generating a second clock by delaying said first clock according to said control signal,
  a phase comparison circuit comparing phases of a clock and said reference clock, and
  a shift register outputting said control signal according to result of comparison at said phase comparison circuit; and
  a phase determination circuit for determining whether phase difference between said internal clock and said second clock is at most a predetermined value or not.

16. The semiconductor device according to claim 15, wherein
  said internal clock generation circuit further includes a transmit section supplying to said first delay circuit said clock as said first clock and operates as a digital DLL circuit.

17. A semiconductor device comprising:
a terminal for receiving from an external source predetermined data at the normal operation; and
an internal clock generation circuit for generating an internal clock in synchronization with a reference clock, said internal clock generation circuit including,
  a phase comparison circuit comparing phases of said internal clock and said reference clock, said phase comparison circuit having an output switching circuit outputting an input signal on said terminal instead of result of comparison at said phase comparison circuit according to a test mode signal activated when the operation of said internal clock generation circuit is confirmed, and
  a first delay circuit generating said internal clock by delaying a first clock correlating with said reference clock according to an output of said phase comparison circuit.

18. A semiconductor device comprising:
an internal clock generation circuit for generating an internal clock in synchronization with a reference clock, including,
  a first delay circuit generating said internal clock by delaying a first clock according to an n-bit (n: an integer larger than 2) control signal,
  a second delay circuit generating a second clock by delaying said first clock according to said control signal,
  a phase checking circuit for checking whether the phase of said internal clock is appropriate or not, and
  a shift register outputting said control signal according an output of said phase checking circuit; and
  a phase determination circuit for determining whether phase difference between said internal clock and said second clock is at most a predetermined value or not.

19. The semiconductor device according to claim 18, wherein
  said phase checking circuit compares the phase of said internal clock with the phase of said first clock, and
  said internal clock generation circuit further includes a transmit section supplying to said delay circuit said reference clock as said first clock and operates as a digital DLL circuit.

20. The semiconductor device according to claim 19, further comprising a semiconductor memory device for receiving/transmitting storage data in synchronization with said internal clock.

21. The semiconductor device according to claim 18, wherein
  said internal clock generation circuit further includes an inversion circuit for inverting said internal clock and outputting said first clock and operates as a digital PLL circuit.

22. The semiconductor device according to claim 21, further comprising a semiconductor memory device for receiving/transmitting storage data in synchronization with said internal clock.

* * * * *